United States Patent
Gu et al.

(10) Patent No.: US 11,783,772 B2
(45) Date of Patent: Oct. 10, 2023

(54) ARRAY SUBSTRATE, DISPLAY PANEL, AND DISPLAY DEVICE

(71) Applicant: Wuhan Tianma Micro-Electronics Co., Ltd., Wuhan (CN)

(72) Inventors: Jiachang Gu, Wuhan (CN); Tao Peng, Wuhan (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 17/677,763

(22) Filed: Feb. 22, 2022

(65) Prior Publication Data

US 2023/0141543 A1    May 11, 2023

(30) Foreign Application Priority Data

Nov. 5, 2021 (CN) .......................... 202111307842.8

(51) Int. Cl.
*G09G 3/3233* (2016.01)
*G09G 3/3266* (2016.01)
*G11C 19/28* (2006.01)

(52) U.S. Cl.
CPC ......... *G09G 3/3233* (2013.01); *G09G 3/3266* (2013.01); *G11C 19/287* (2013.01); *G09G 2300/0408* (2013.01); *G09G 2300/0819* (2013.01); *G09G 2300/0852* (2013.01); *G09G 2310/0286* (2013.01)

(58) Field of Classification Search
CPC ............... G09G 3/3233; G09G 3/3266; G09G 2300/0408; G09G 2300/0819; G09G 2300/0852; G09G 2310/0286; G11C 19/287
See application file for complete search history.

(56) References Cited

U.S. PATENT DOCUMENTS

| 2018/0373102 A1* | 12/2018 | Chai | G02F 1/134336 |
| 2021/0358384 A1* | 11/2021 | Liu | G09G 3/2092 |
| 2022/0343856 A1* | 10/2022 | Yu | G09G 3/3266 |

FOREIGN PATENT DOCUMENTS

| CN | 105702295 A | 6/2016 | |
| CN | 108777129 A | 11/2018 | |
| CN | 109461407 A * | 3/2019 | ........... G09G 3/3208 |
| CN | 109461407 A | 3/2019 | |

* cited by examiner

*Primary Examiner* — Premal R Patel
(74) *Attorney, Agent, or Firm* — ANOVA LAW GROUP PLLC

(57) ABSTRACT

An array substrate, a display panel and a display device are provided. The array substrate has a display area and a non-display area surrounding the display area. The array substrate includes: pixel circuits arranged in the display area in an array along a first direction and a second direction; a first gate driving circuit in the non-display area including first shift register units; and a second gate driving circuit in the non-display area including a plurality of second shift register units in cascade connection. The first gate driving circuit and the second gate driving circuit are electrically connected to different transistors in the pixel circuits; and an orthographic projection of the first gate driving circuit on a plane of the array substrate and an orthographic projection of the second gate driving circuit on the plane of the array substrate at least partially overlap along the second direction.

22 Claims, 18 Drawing Sheets

ARRAY SUBSTRATE, DISPLAY PANEL, AND DISPLAY DEVICE

CROSS-REFERENCE TO RELATED APPLICATION

This application claims the priority of Chinese Patent Application No. 202111307842.8, filed on Nov. 5, 2021, the content of which is incorporated herein by reference in its entirety.

TECHNICAL FIELD

The present disclosure generally relates to the field of display technology and, more particularly, relates to an array substrate, a display panel, and a display device.

BACKGROUND

With the development of display technology, users increasingly require display devices with a high screen-to-body ratio or even a full screen. For example, a pixel circuit of a display device needs to be jointly controlled by a scan driving signal and a light-emitting control signal. Therefore, a scan driving circuit and a light-emitting control driving circuit may be provided in a peripheral non-display area of the display device. However, in existing technologies, the non-display area occupied by the scan driving circuit and the light-emitting control driving circuit is large, which makes it difficult to realize a display panel with a high screen-to-body ratio.

SUMMARY

One aspect of the present disclosure provides an array substrate. The array substrate has a display area and a non-display area surrounding the display area. The array substrate includes: pixel circuits arranged in the display area in an array along a first direction and a second direction; a first gate driving circuit in the non-display area including first shift register units; and a second gate driving circuit in the non-display area including a plurality of second shift register units in cascade connection. The first gate driving circuit and the second gate driving circuit are electrically connected to different transistors in the pixel circuits; and an orthographic projection of the first gate driving circuit on a plane of the array substrate and an orthographic projection of the second gate driving circuit on the plane of the array substrate at least partially overlap along the second direction.

Another aspect of the present disclosure provides a display panel. The display panel includes an array substrate. The array substrate has a display area and a non-display area surrounding the display area. The array substrate includes: pixel circuits arranged in the display area in an array along a first direction and a second direction; a first gate driving circuit in the non-display area including first shift register units; and a second gate driving circuit in the non-display area including a plurality of second shift register units in cascade connection. The first gate driving circuit and the second gate driving circuit are electrically connected to different transistors in the pixel circuits; and an orthographic projection of the first gate driving circuit on a plane of the array substrate and an orthographic projection of the second gate driving circuit on the plane of the array substrate at least partially overlap along the second direction.

Another aspect of the present disclosure provides a display device. The display device includes a display panel. The display panel includes a display panel. The display panel includes an array substrate. The array substrate has a display area and a non-display area surrounding the display area. The array substrate includes: pixel circuits arranged in the display area in an array along a first direction and a second direction; a first gate driving circuit in the non-display area including first shift register units; and a second gate driving circuit in the non-display area including a plurality of second shift register units in cascade connection. The first gate driving circuit and the second gate driving circuit are electrically connected to different transistors in the pixel circuits; and an orthographic projection of the first gate driving circuit on a plane of the array substrate and an orthographic projection of the second gate driving circuit on the plane of the array substrate at least partially overlap along the second direction.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
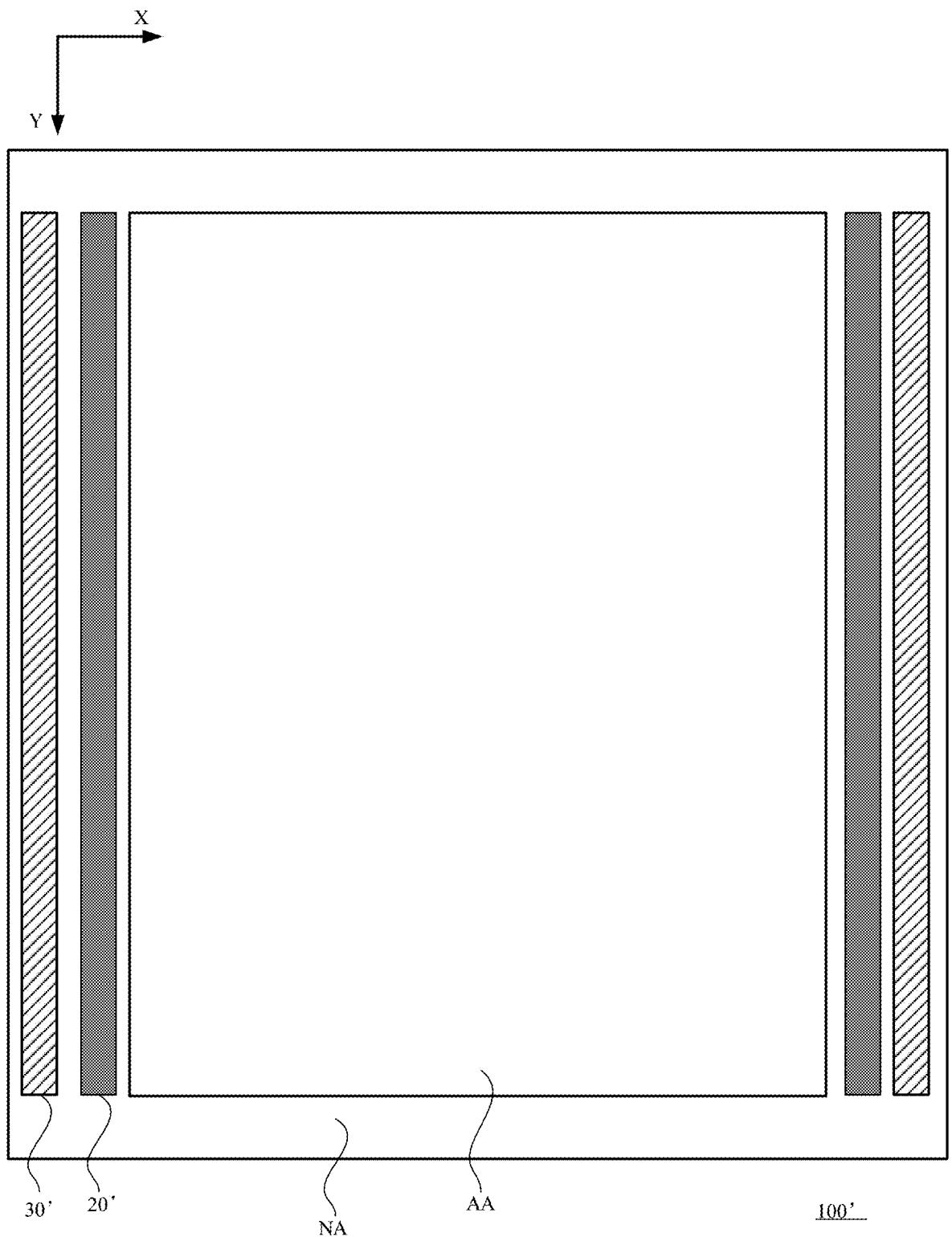
FIG. 1 illustrates a top view of an array substrate.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width, and depth should be considered during practical fabrication.

In the present disclosure, relational terms such as first and second are only used to distinguish one entity or operation from another entity or operation, and do not necessarily require or imply any such actual relationship between these entities or operations or order. Moreover, the terms "including", "comprising" or any other variants thereof are intended to cover non-exclusive inclusion, such that a process, method, article, or device that includes a series of elements includes not only those elements, but also those that are not explicitly listed or also include elements inherent to this process, method, article or equipment. If there are no more restrictions, the elements defined by the sentence "including . . . " do not exclude the existence of other same elements in the process, method, article, or equipment that includes the elements.

It should be understood that when describing the structure of a component, when a layer or area is referred to as being "on" or "above" another layer or another area, it may mean directly on the other layer or area, or it may also includes other layers or areas between it and another layer or another area. And, if the component is turned over, the layer or area will be "below" or "under" the other layer or area.

In the present disclosure, the term "electrical connection" refers to that two components are directly electrically connected with each other, or the two components are electrically connected via one or more other components.

An organic light-emitting diode (OLED) array substrate is provided with a pixel circuit to drive OLED light-emitting elements. The OLED light-emitting elements are driven by the current. The pixel circuit includes a driving transistor. However, drift of threshold voltage of the driving transistor will cause problems including inhomogeneous display. Therefore, a pixel circuit with a compensation function is used to compensate for the drift of the threshold voltage of the driving transistor. Since the pixel circuit needs to provide a plurality of transistors and a plurality of scanning signals to realize the function of threshold voltage drift compensation, a scan driving circuit and a light-emitting control driving circuit are disposed in a non-display area of the array substrate to provide scan signals for the pixel circuits. As shown in FIG. 1, the scan driving circuit 20' and the light-emitting control driving circuit 30' are distributed in the non-display area of the array substrate 100' along a first direction X (the first direction X can be understood as the left-right direction). That is, the scan driving circuit 20' and the light-emitting control driving circuit 30' are distributed in two columns, thereof occupying a relatively large width of the non-display area. Further, wires connecting the pixel circuit and the scan driving circuit 20' close to the outside of the display panel need to pass through an area where the light-emitting control circuit 30' is located, and is easily coupled with the light-emitting control circuit. The signal stability is affected, which is not conducive to the realization of the display panel with a high screen-to-body ratio and also affects the display effect of the display panel.

The present disclosure provides an array substrate, a display panel, and a display device, to at least partially alleviate above problems.

Figure 2:
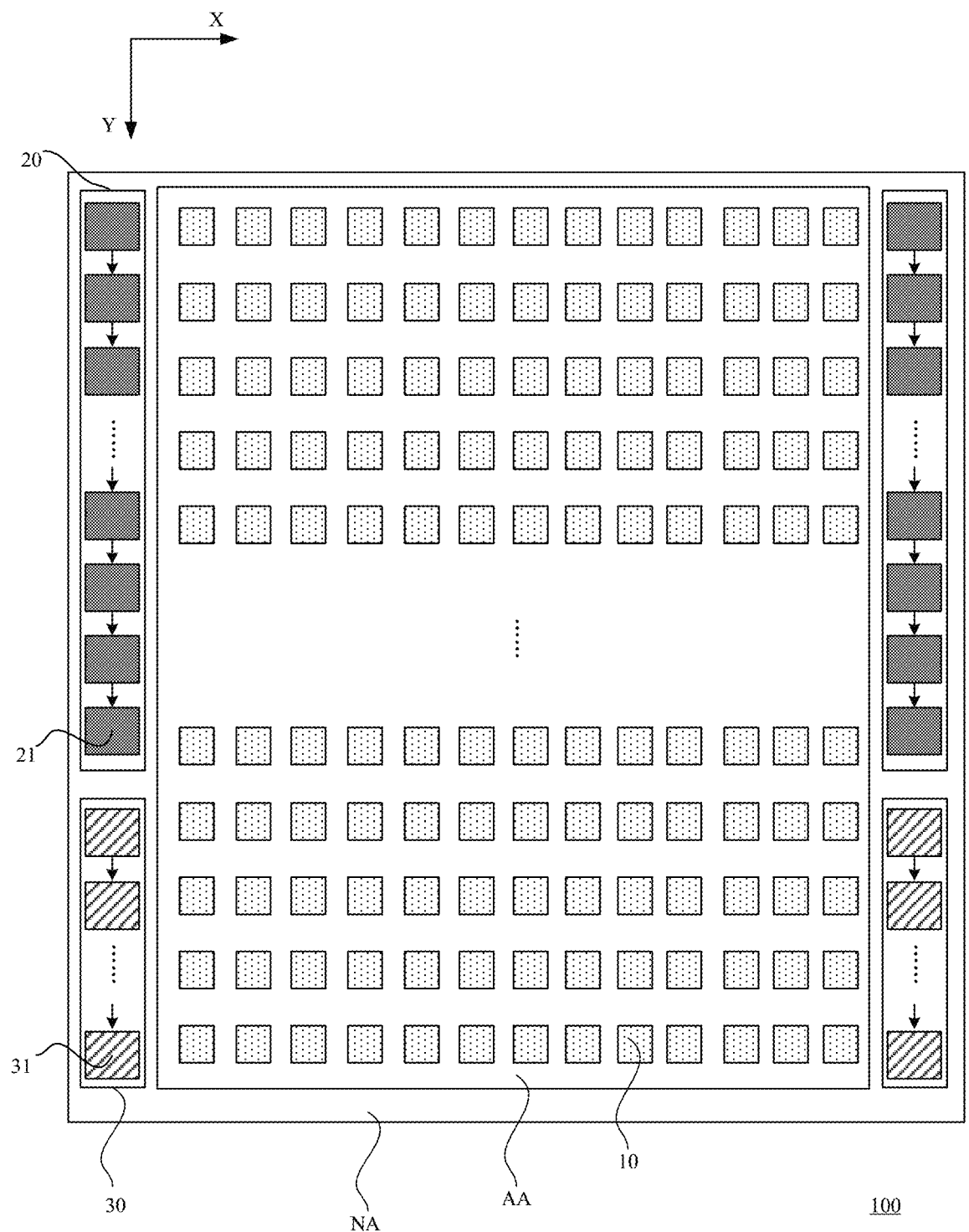
FIG. 2 illustrates a top view of an exemplary array substrate consistent with various disclosed embodiments in the present disclosure.

One embodiment of the present disclosure provides an array substrate, as shown in FIG. 2. The array substrate 100 may include a display area AA and a non-display area NA at least partially surrounding the display area AA. The array substrate 100 may include a plurality of pixel circuits 10, a first gate driving circuit 20, and a second gate driving circuit 30.

The plurality of pixel circuits 10 may be distributed in an array in the display area AA. For example, the plurality of pixel circuits 10 may be arranged in an array in a first direction X and a second direction Y that intersect with each other. Exemplarily, the first direction X and the second direction Y may be perpendicular to or cross each other. The first direction X may be a row direction, and the second direction Y may be a column direction.

The first gate driving circuit 20 and the second gate driving circuit 30 may be both arranged in the non-display area NA and at a same side of the display area AA. For example, in the first direction X, the first gate driving circuit 20 and the second gate driving circuit 30 may be provided at least one of two sides of the display area AA. For description purposes only, the embodiment shown in FIG. 2 where the first gate driving circuit 20 and the second gate driving circuit 30 are provided at both sides of the display area AA in the first direction X is used as an example to illustrate the present disclosure, and does not limit the scope of the present disclosure.

The first gate driving circuit 20 may include a plurality of cascaded first shift register units 21, and the second gate driving circuit 30 may include a plurality of cascaded second shift register units 31.

For example, light-emitting elements connected to the plurality of pixel circuits 10 may be formed in the display area AA of the array substrate 100 to obtain a display panel. The plurality of pixel circuits 10 may be used to drive the light-emitting elements to emit light. The plurality of pixel circuits 10 may include a plurality of transistors, and the first gate driving circuit 20 and the second gate driving circuit 30 may be electrically connected to different transistors in the plurality of pixel circuits 10 to provide gate driving signals for the different transistors of the plurality of transistors. An orthographic projection of the first gate driving circuit 20 on the array substrate 100 and an orthographic projection of the second gate driving circuit 30 on the array substrate 100 may at least partially overlap with each other along the second direction Y. Taking the second direction Y as the column direction as an example, the first gate driving circuit 20 and the second gate driving circuit 30 may be located in the same column, and the plurality of first shift register units 21 of the first gate driving circuit 20 and the plurality of second shift register units 31 of the second gate driving circuit 30 may be located in the same column.

In the present disclosure, the orthographic projection of the first gate driving circuit 20 on the array substrate 100 may at least partially overlap the orthographic projection of the second gate driving circuit 30 on the array substrate 100 along the second direction Y. Taking the second direction Y as the column direction as an example, the first gate driving circuit 20 and the second gate driving circuit 30 may be located in the same column, and distributed in two columns. In comparison with the first gate driving circuit 20' and the second gate driving circuit 30' arranged in two columns, the width of one column of driving circuits may be reduced, such that the size of the non-display area NA in the first direction X may be compressed, beneficial to increase the screen-to-body ratio of the display panel. Further, since the first gate driving circuit 20 and the second gate driving circuit 30 may be located in the same column, in comparison with the first gate driving circuit 20' and the second gate driving circuit 30' arranged in two columns, the distance between the second gate driving circuit 30 and the plurality of pixel circuits 10 may be closer. Correspondingly, when the second gate driving circuit 30 is connected to the plurality of pixel circuits 10, the connection wiring between them may not need to pass through the first gate driving circuit 20. The length of the connection wiring between them may be reduced, thereby reducing the voltage drop and delay. On the other hand, when the second gate driving circuit 30 is connected to the plurality of pixel circuits 10, the connection wiring between them may not need to pass through the first gate driving circuit 20, which may avoid coupling between the connection wiring and the first gate driving circuit 20. Correspondingly, the signal output by the second gate driving circuit 30 may be stably transmitted to the plurality of pixel circuits 10.

To be able to place the plurality of first shift register units 21 of the first gate driving circuit 20 and the plurality of second shift register units 31 of the second gate driving circuit 30 in the same column, the size of each of the plurality of first shift register units 21 and each of the plurality of second shift register units 31 in the second direction Y may be appropriately compressed, and the size of each of the plurality of first shift register units 21 and each of the plurality of second shift register units 31 in the first direction X may be appropriately increased. The size of each of the plurality of first shift register units 21 or the size of each of the plurality of second shift register units 31 after being increased in the first direction X may be smaller than a sum of the size of one of the plurality of first shift register units 21 and the size of one of the plurality of second shift register units 31 in the first direction X before being increased. Correspondingly, even though the size of each of the plurality of first shift register units 21 and each of the plurality of second shift register units 31 in the first direction X may be increased, the plurality of first shift register units 21 of the first gate driving circuit 20 and the plurality of second shift register units 31 of the second gate driving circuit 30 may be arranged in the same column, and the overall size of the plurality of first shift register units 21 and the plurality of second shift register units 31 in the first direction X is not increased and the space occupied by two columns may be reduced. The present disclosure may reduce the overall size of the plurality of first shift register units 21 and the plurality of second shift register units 31 in the first direction X, to further reduce the space occupied by the non-display area in the display panel and increase the screen-to-body ratio of the display panel.

In one embodiment, the orthographic projection of the first gate driving circuit 20 on the array substrate 100 and the orthographic projection of the second gate driving circuit 30 on the array substrate 100 may overlap with each other in the second direction Y. For example, the length of the first gate driving circuit 20 in the first direction X and the length of the second gate driving circuit 30 in the one direction X may be the same.

The present disclosure has no limit on the specific structure of the plurality of pixel circuits 10. For a better understanding of the present disclosure where the first gate driving circuit 20 and the second gate driving circuit 30 are electrically connected to different transistors in one pixel circuit 10 of the plurality of pixel circuits, one pixel circuit 10 shown in FIG. 3 including seven transistors and one storage capacitor and with the driving timing diagram shown in FIG. 4 will be used as an example to illustrate the present disclosure.

Figure 3:
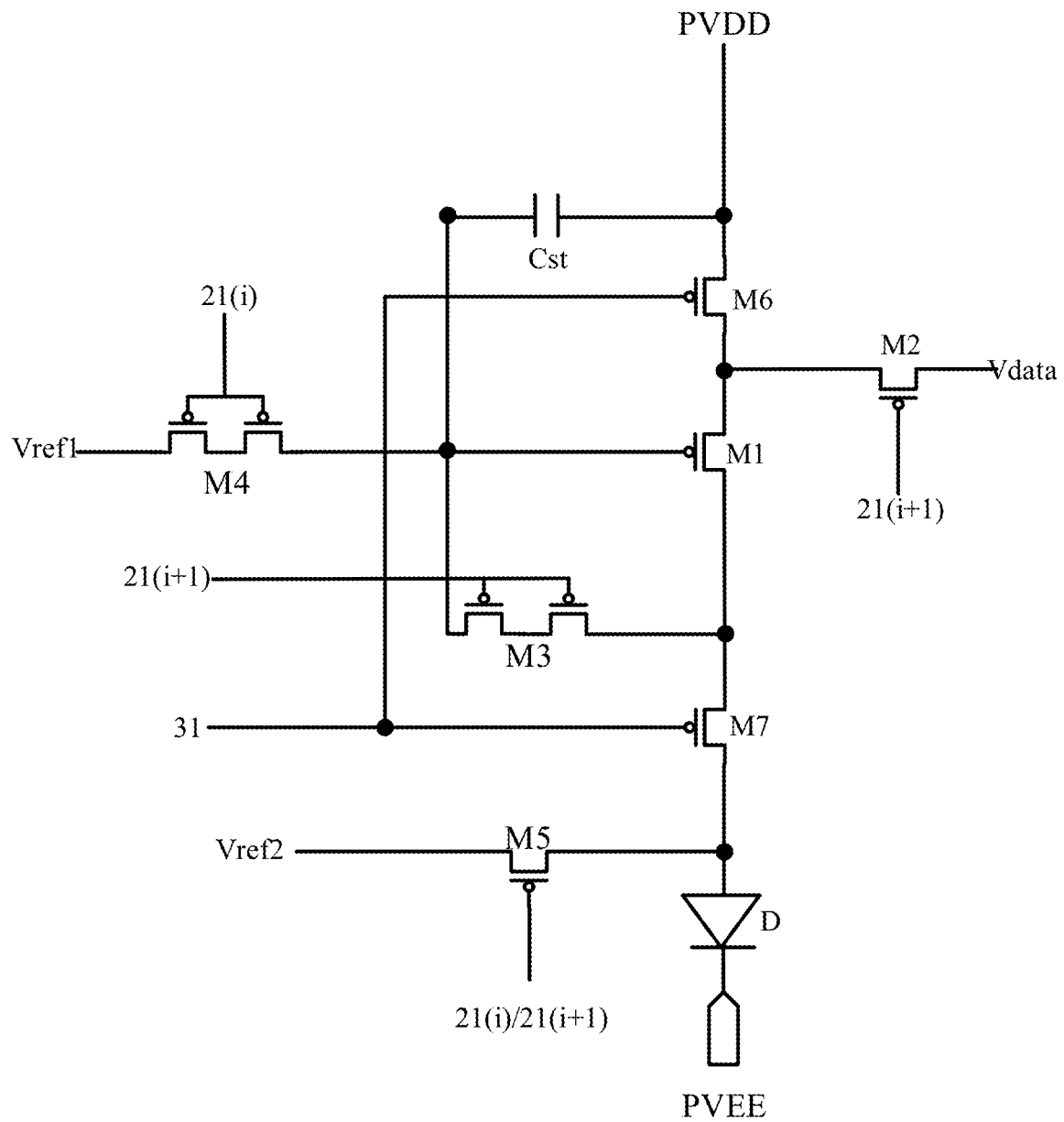
FIG. 3 illustrates a circuit structure of a pixel circuit in an exemplary array substrate consistent with various disclosed embodiments in the present disclosure.

As shown in FIG. 3, M1 may be a drive transistor, M2 may be a data writing transistor, M3 may be a compensation transistor, M4 may be a gate initialization transistor, M5 may be an anode initialization transistor, M6 may be a power writing transistor, and M7 may be a light-emitting control transistor. D may be a light-emitting element, PVDD may be a first power supply terminal, PVEE may be a second power supply terminal, Vdata may be a data signal terminal, Vref1 may be a first reset signal terminal, and Vref2 may be a second reset signal terminal. Exemplarily, the first gate driving circuit 20 may be a scan driving circuit, and the second gate driving circuit 30 may be a light-emitting control driving circuit. The first gate driving circuit 20 may be used to provide a scan signal to the pixel circuit 10, and the second gate driving circuit 30 may be used to provide a light-emitting control signal to the pixel circuit 10. A gate of the gate initialization transistor M4 may be electrically connected to an output terminal of the i-th-stage first shift register unit 21(i), and a gate of the data writing transistor M2 and a gate of the compensation transistor M3 may be connected to an output terminal of the (i+1)-th-stage first shift register unit 21(i+1). Gates of the power writing transistor M6 and the light-emitting control transistor M7 may be electrically connected to an output terminal of the second shift register unit 31. A gate of the anode initialization transistor M5 may be electrically connected to an output terminal of the i-th-stage first shift register unit 21(i) or the (i+1)-th-stage first shift register unit 21(i+1).

Further, the first power supply terminal PVDD may be used to provide a power supply voltage to the driving transistor T1, and the first power supply terminal PVDD may be used to provide a positive voltage. The second power terminal PVEE may provide a negative voltage. The first reset signal terminal Vref1 and the second reset signal terminal Vref2 may provide a negative voltage. Optionally, the first reset signal terminal Vref1 may be multiplexed as the second reset signal terminal Vref2. The data signal terminal Vdata may be used to provide a data signal to the pixel circuit 10.

Figure 4:
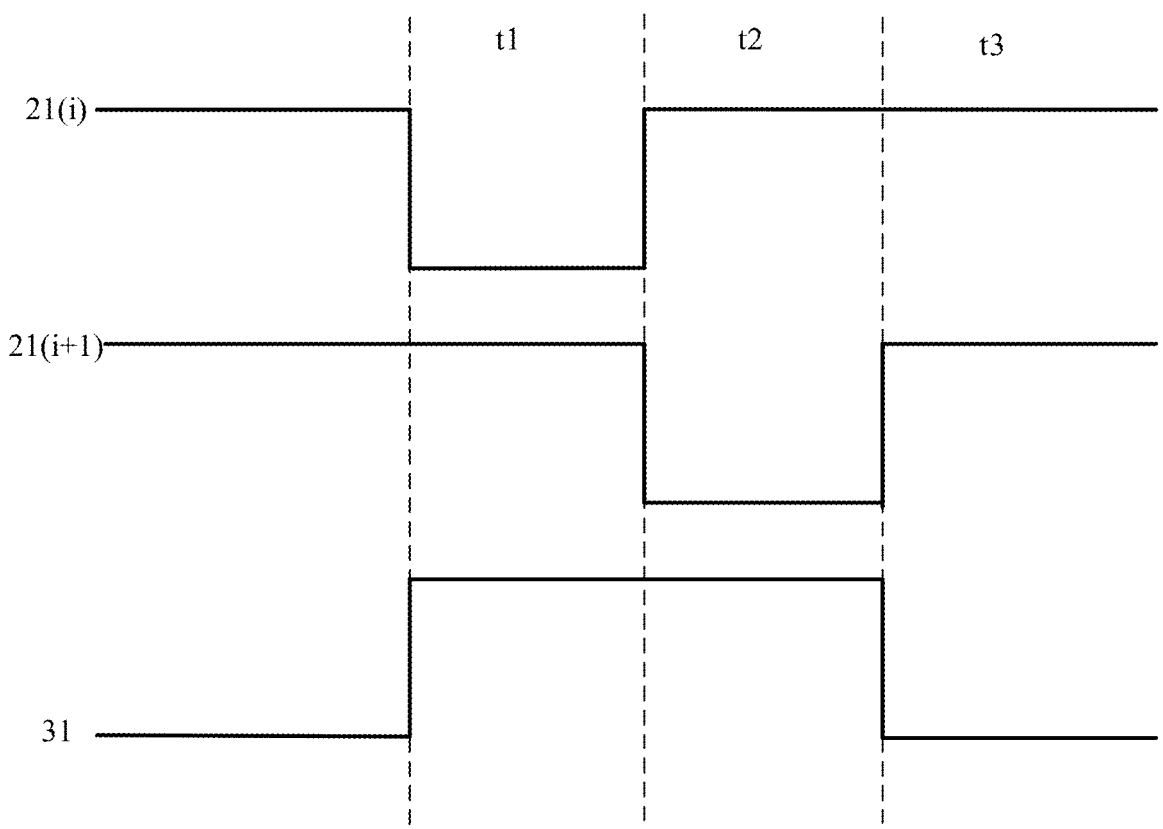
FIG. 4 illustrates a timing diagram of FIG. 3.

In one embodiment shown in FIG. 3, each of the transistors may be a P-type transistor. The on-level of the P-type transistor may be low, and the off-level may be high. As shown in FIG. 4, a driving process of the pixel circuit 10 may include a reset phase t1, a data writing phase t2, and a light-emitting phase t3. In the reset phase t1, the first shift register unit 21(i) of the i-th stage may provide a low-level signal, the gate initialization transistor M4 may be turned on, and the signal at the first reset signal terminal Vref1 may reset the gate potential of the driving transistor M1. In the data writing phase t2, the first shift register unit 21(i+1) of the (i+1)-th stage may provide a low-level signal, the data writing transistor M2 and the compensation transistor M3 may be turned on, and the data signal on the data signal line Vdata may be written to the gate of the driving transistor M1 and to compensate the threshold voltage of the driving transistor M1. In the light-emitting phase t3, the second shift register unit 31 may provide a low-level signal, the power writing transistor M6 and the light-emitting control transistor M7 may be turned on, the driving current generated by the driving transistor M1 may be transmitted to the light-emitting element D, and the light-emitting element D may emit light. Further, when the gate of the anode initialization transistor M5 is electrically connected to the output terminal of the first shift register unit 21(i) of the i-th stage, the anode initialization transistor M5 may be turned on during the reset phase t1, and the second reset signal terminal Vref2 may reset the anode potential of the light-emitting element D. When the gate of the anode initializing transistor M5 is electrically connected to the output terminal of the first shift register unit 21(i+1) of the (i+1)-th stage, the anode initializing transistor M5 may be turned on in the data writing phase t2, and the second reset signal terminal Vref2 may reset the anode potential of the light-emitting element D. The embodiments shown in FIG. 3 and FIG. 4 are used as examples to illustrate the present disclosure only, and do not limit the scope of the present disclosure.

Figure 5:
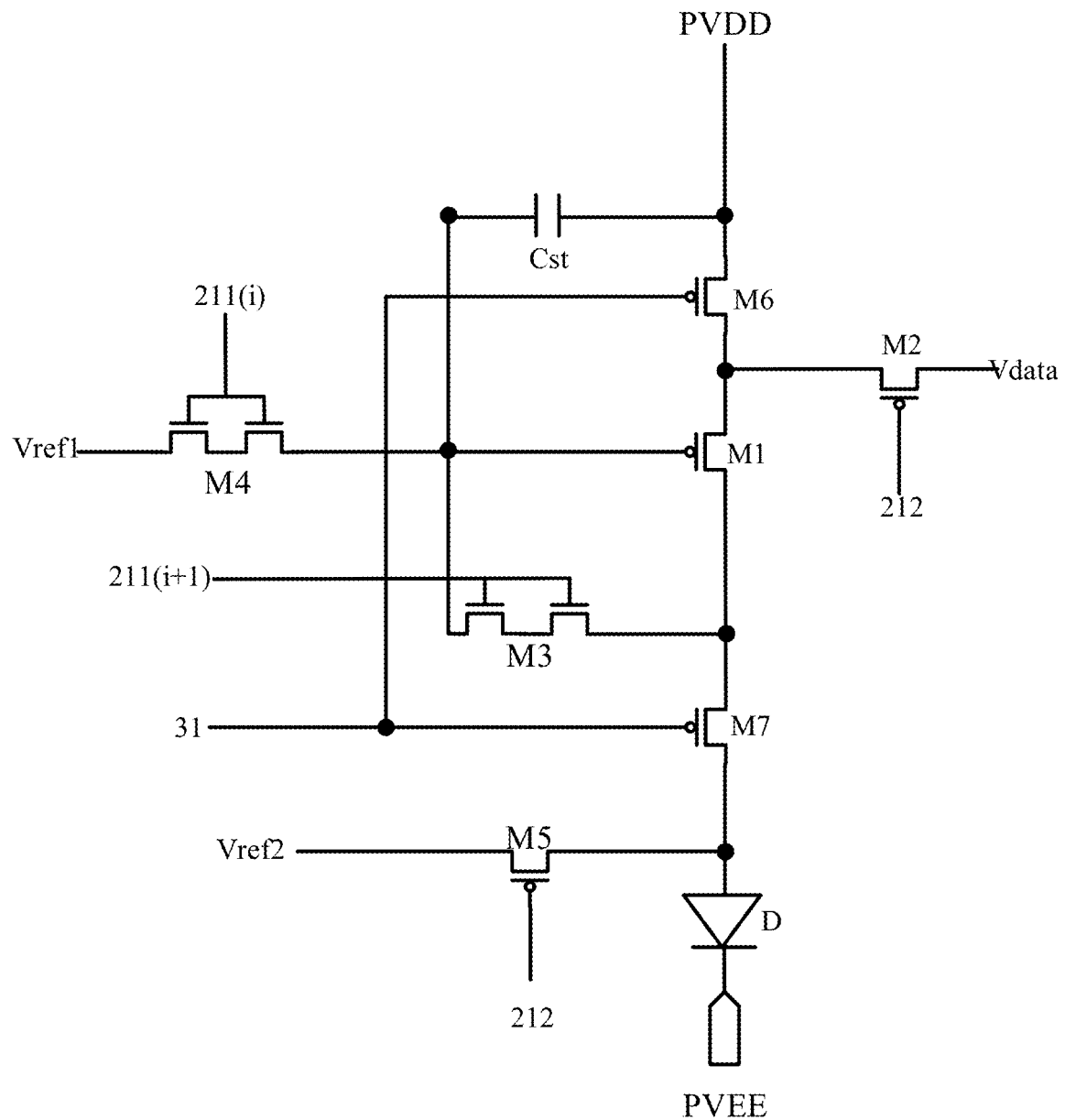
FIG. 5 illustrates another circuit structure of a pixel circuit in an exemplary array substrate consistent with various disclosed embodiments in the present disclosure.

The gate potential of the driving transistor M1 which is more stable may be more favorable to the light-emitting stability of the light-emitting element. For example, the stability of the gate potential of the driving transistor M1 may be ensured by reducing the leakage current of the gate of the driving transistor M1. A low-temperature polysilicon transistor is usually a P-type transistor, and an oxide transistor is usually an N-type transistor. A P-type transistor has higher mobility, and an N-type transistor has a lower leakage current. The pixel circuit 10 may include first-type transistors which are N-type transistors and second-type transistors which are P-type transistors. As shown in FIG. 5 which uses the pixel circuit 10 including transistors M1 to M7 as an example, the gate of the driving transistor M1 may be electrically connected to the gate initialization transistor M4 and the compensation transistor M3. The gate initialization transistor M4 and the compensation transistor M3 may be set as N-type transistors to improve the stability of the gate potential of the driving transistor M1. The other transistors may be set as P-type transistors.

When the pixel circuit 10 includes N-type transistors and P-type transistors, at least two types of scanning signals need to be provided. In one embodiment, the first gate driving circuit 20 and the second gate driving circuit 30 may both be scan driving circuits. One of the first gate driving circuit 20 and the second gate driving circuit 30 may be used to control the N-type transistors in the pixel circuit, and another may be used to control the P-type transistors in the pixel circuit.

Figure 6:
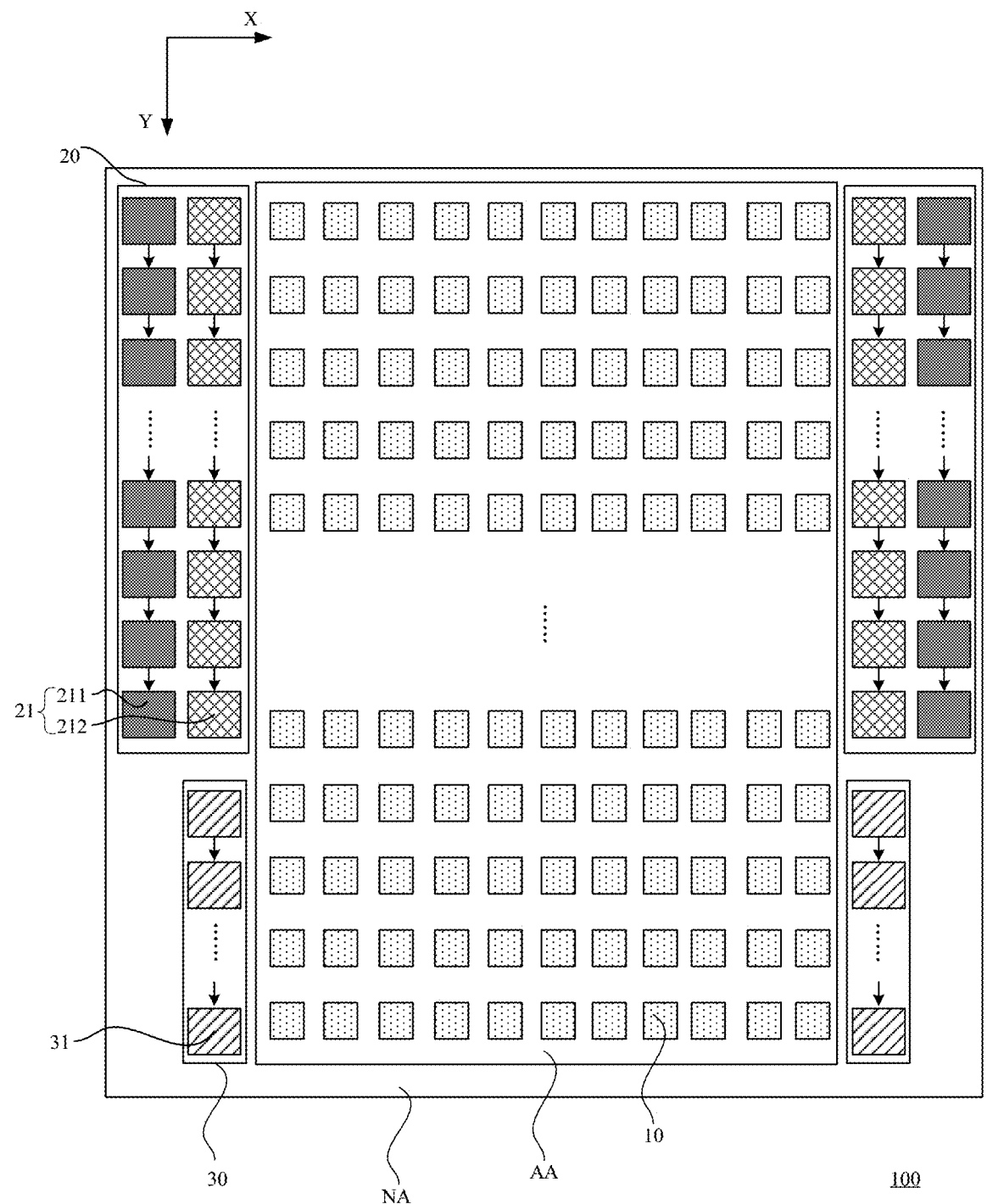
FIG. 6 illustrates a top view of another exemplary array substrate consistent with various disclosed embodiments in the present disclosure.

When the pixel circuit 10 includes N-type transistors and P-type transistors, in addition to two types of scanning signals, a light-emitting control signal may be also required. In some alternative embodiments, the first gate driving circuit 20 may be a scan driving circuit, and the second gate driving circuit 30 may be a light-emitting control driving circuit. As shown in FIG. 6, each first shift register unit 21 of the plurality of first shift register units 21 may include a first-type shift register unit 211 and a second-type shift register unit 212. One of the first-type shift register unit 211 and the second-type shift register unit 212 may be electrically connected to the first-type transistors in the pixel circuit 10, and another of the first-type shift register unit 211 and the second-type shift register unit 212 may be electrically connected to the second-type transistors in the pixel circuit 10. As shown in FIG. 5, the first-type shift register unit 211 may be electrically connected to the first-type transistors which are N-type transistors in the pixel circuit 10, and the second-type shift register unit 212 may be connected to the second-type transistors in the pixel circuit 10 which are P-type transistors. Of course, in some other embodiments, the first-type shift register unit 211 may be electrically connected to the second-type transistors in the pixel circuit 10 which are P-type transistors, and the second-type shift register unit 212 may be connected to the first-type transistors which are N-type transistors in the pixel circuit 10.

As shown in FIG. 5, in one embodiment, the gate of the gate initialization transistor M4 may be electrically connected to the output terminal of the i-th stage first-type shift register unit 211(i), and the gate of the compensation transistor M3 may be electrically connected to the output terminal of the (i+1)-th stage first-type shift register unit 211(i+1). The gates of the data writing transistor M2 and the anode initialization transistor M5 may be electrically connected to the output terminal of the second-type shift register unit 212. Of course, the anode initialization transistor M5 may also be set as the N-type transistor. In the case where the anode initialization transistor M5 is an N-type transistor, the gate of the anode initialization transistor M5 may be electrically connected to the i-th stage first-type shift register unit 211 (i) or the output terminal of the (i+1)-th stage first-type shift register unit 211(i+1). The gates of the power writing transistor M6 and the light-emitting control transistor M7 may still be electrically connected to the output terminal of the second shift register unit 31.

Figure 7:
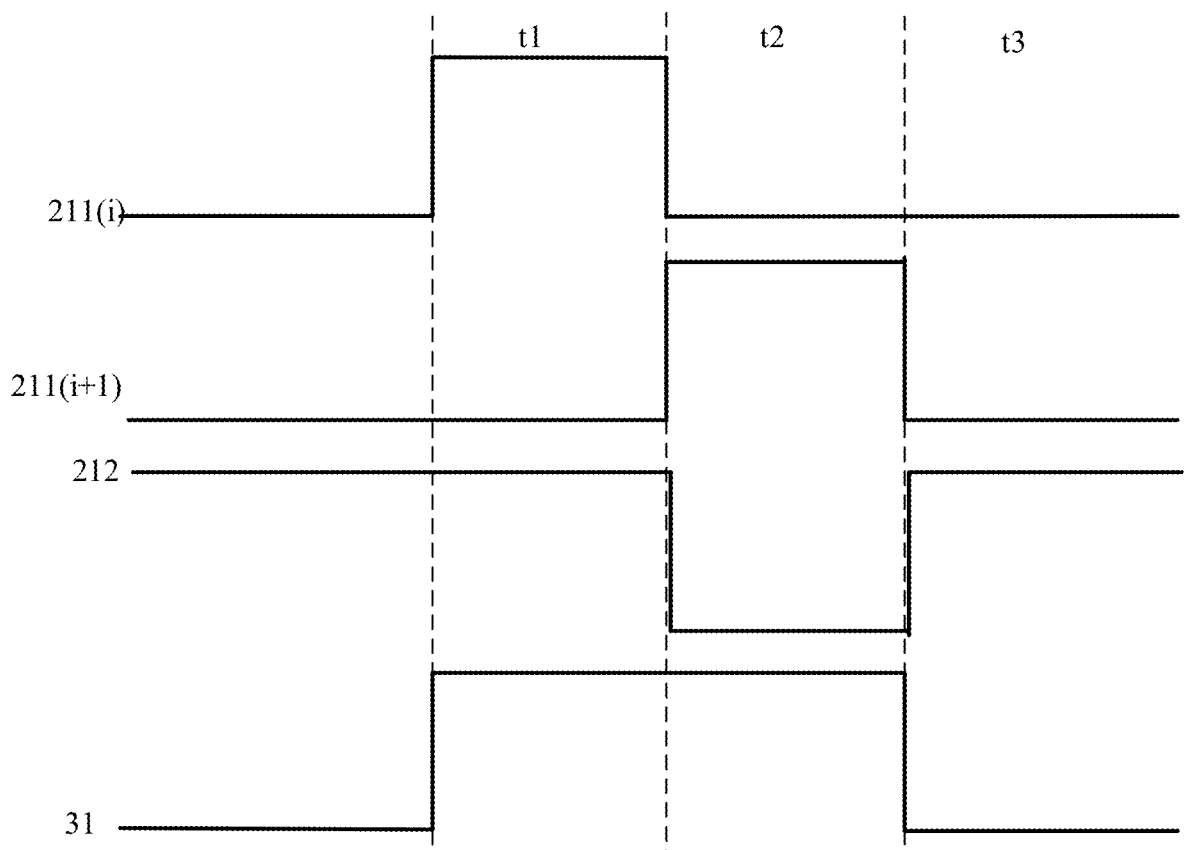
FIG. 7 illustrates a timing diagram of FIG. 5.

The on-level of the N-type transistor is a high level, and the off-level is a low level. When the pixel circuit 10 includes N-type transistors and P-type transistors, to better understand the working process of the pixel circuit 10, please refer to FIG. 7. The driving process of the pixel circuit 10 may still include a reset stage t1, a data writing stage t2, and a light-emitting stage t3. In the reset phase t1, the i-th stage first-type shift register unit 211(i) may provide a high-level signal, the gate initialization transistor M4 may be turned on, and the signal at the first reset signal terminal Vref1 may reset the gate potential of the driving transistor M1. In the data writing phase t2, the (i+1)—stage first-type shift register unit 211(i+1) may provide a high level signal, the second-type shift register unit 212 may provide a low level signal, and the data write transistor M2 and the compensation transistor M3 may be turned on, the data signal on the data signal line Vdata may be written to the gate of the driving transistor M1, and the threshold voltage of the driving transistor M1 may be compensated. Further, the anode initialization transistor M5 may be turned on, and the second reset signal terminal Vref2 may reset the anode potential of the light-emitting element D. In the light-emitting phase t3, the second shift register unit 31 may provide a low-level signal, the power writing transistor M6 and the light-emitting control transistor M7 may be turned on, the driving current generated by the driving transistor M1 may be transmitted to the light-emitting element D, and the light-emitting element D may emit light. The embodiments shown in FIG. 5 and FIG. 7 are used as examples to illustrate the present disclosure only, and do not limit the scope of the present disclosure.

As shown in FIG. 6, the orthographic projection of the first-type shift register unit 211 on the plane where the array substrate 100 is located and the orthographic projection of the second-type shift register unit 212 on the plane where the array substrate 100 is located may have no overlap along the second direction Y. The orthographic projection of the second gate driving circuit 30 on the plane where the array substrate 100 is located may overlap the orthographic projection of one of the first-type of shift register unit 211 and the second-type shift register unit 212 on the plane where the array substrate 100 along the second direction Y. For example, the second direction Y may be the column direction, the first-type shift register unit 211 and the second-type shift register unit 212 may be located in different columns. The second gate driving circuit 30 may be located at one column same as one of the first-type register unit 211 and the second-type shift register unit 212.

As users increasingly demand display devices with high pixel density (pixels per inch, PPI), the number of rows of the plurality of pixel circuits 10 is also increasing. The number of first-type shift register units 211, the number of second-type shift register units 212, and the number of the plurality of second shift register units 31 in the second gate driving circuit 30 may be also increasing. To ensure the performance of each shift register unit, a size of each shift register unit cannot be unlimitedly compressed. If the first-type shift register units 211, the second-type shift register units 212, and the second gate driving circuit 30 are arranged in the same column at the same time, there will not be enough space in the second direction Y to accommodate the three items. In the present disclosure, the second gate driving circuit 30 and one of the first-type shift register unit 211 and the second-type shift register unit 212 may be arranged in the same column. In comparison with the setup of three columns, the width of one column may be saved, such that the size of the non-display area NA in the first direction X may be compressed, which is beneficial to increase the screen-to-body ratio of the display panel. Also, it may be not necessary to increase the size of the non-display area NA of the array substrate 100 in the second direction Y, to accommodate the three items.

To achieve a high PPI, the number of rows of the plurality of pixel circuits 10 may be relatively large. Each row of the plurality of pixel circuits 10 may need to be electrically connected to the plurality of first shift register units 21 and the plurality of second shift register units 31. For example, as shown in FIG. 2, the plurality of first shift register units 21 may be arranged on the same side of the second shift register unit 31 in the second direction Y. For example, the plurality of first shift register units 21 may be all located above, and the plurality of second shift register units 31 may be all located below. In one embodiment, the first row of the plurality of pixel circuits 10 may be electrically connected to the first-stage second shift register unit 3. In this case, a distance between the first row of the plurality of pixel circuits 10 and the first stage second shift register unit 31 electrically connected to the first row of the plurality of pixel circuits 10 in the second direction Y may be large. Similarly, in one example, the last row of the plurality of pixel circuits 10 may be electrically connected to the last stage first shift register unit 21, and a distance between the last row of the plurality of pixel circuits 10 and the last stage first shift register unit 21 electrically connected to the last row of the plurality of pixel circuits 10 in the second direction Y may be also relatively large. Correspondingly, a longer connection wiring may be required, resulting in a large voltage drop and a large signal delay. As shown in FIG. 2, the uppermost one of the plurality of cascaded second shift register units 31 in FIG. 2 may be regarded as the first-stage second shift register unit 31, and the bottom one of the plurality of cascaded first shift register units 21 in FIG. 2 may be regarded as the large stage first shift register unit 21.

Figure 8:
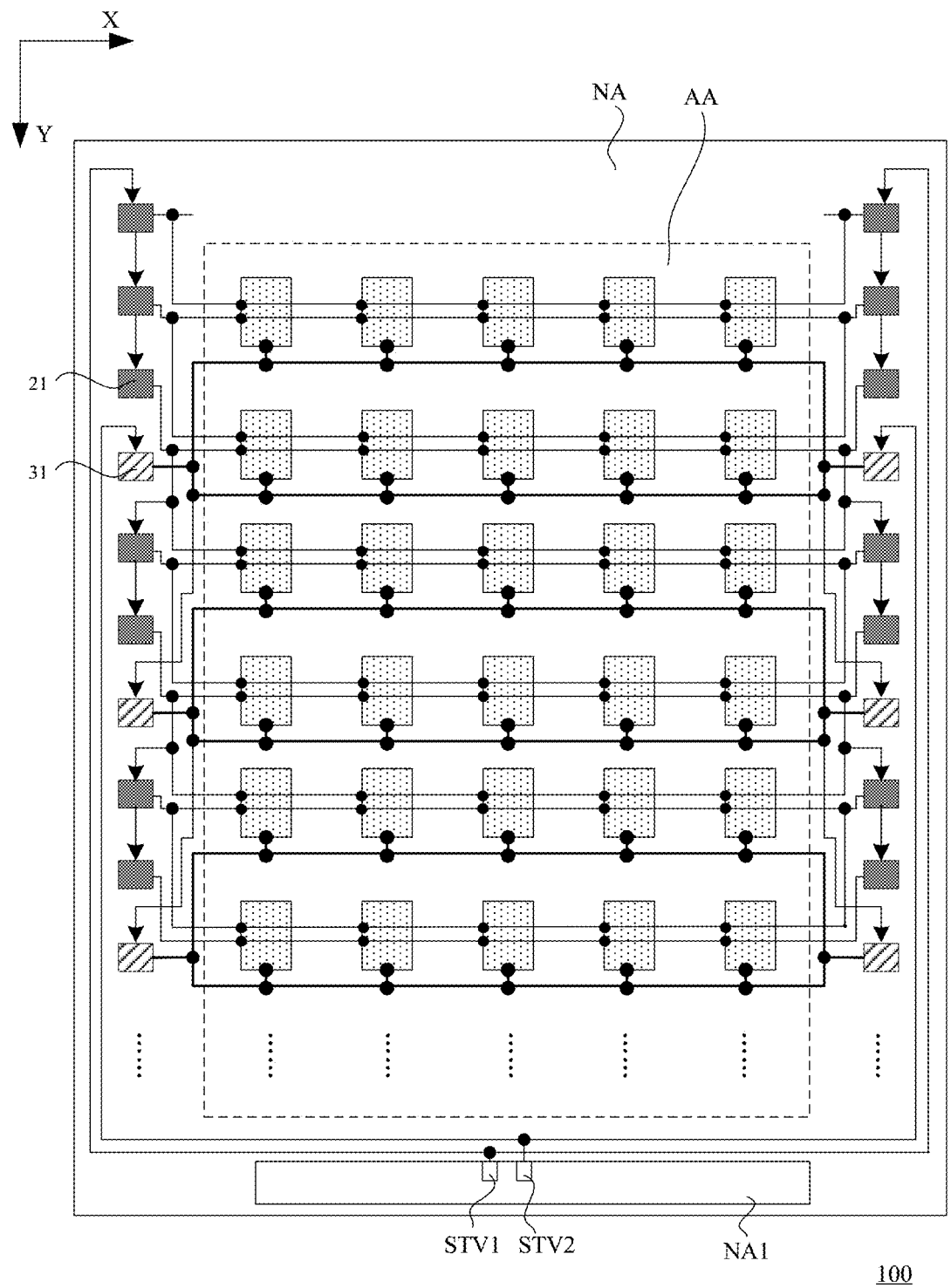
FIG. 8 illustrates a top view of another exemplary array substrate consistent with various disclosed embodiments in the present disclosure.

In some embodiments, the plurality of first shift register units 21 and the plurality of second shift register units 31 may be distributed alternately in the second direction Y. As shown in FIG. 8, in the second direction Y, one of the plurality of first shift register units 21 may be disposed between at least two adjacent second shift register units 31 of the plurality of second shift register units 31. Still taking the first stage second shift register unit 31 and the last stage first shift register unit 21 as examples, it may be equivalent to moving the first stage second shift register unit 31 upward and moving the last stage first shift register unit 21 is downward, such that the distance in the second direction Y between the first row of the plurality of pixel circuits 10 and the first-stage second shift register unit 31 electrically connected to the first row of the plurality of pixel circuit may be shortened, and the distance between the last row of the plurality of pixel circuits 10 and the last stage first shift register unit 21 electrically connected to the last row of the plurality of pixel circuits 10 may be shortened. The large voltage drop and large signal delay induced by the large distance between the plurality of pixel circuits 10 and the plurality of first shift register units 21 and/or the plurality of second shift register units 31 electrically connected to the plurality of pixel circuits 10 in the second direction Y may be alleviated.

In some optional embodiments, to further improve the voltage drop caused by the large distance between the plurality of pixel circuits 10 and the plurality of first shift register units 21 and/or the plurality of second shift register units 31 electrically connected to the plurality of pixel circuits 10 in the second direction Y, one first shift register unit 21 may be disused between any two adjacent shift register units 31.

In some embodiments, the plurality of first shift register units 21 and the plurality of second shift register units 31 may be unevenly distributed alternately in the second direction Y. For example, one first shift register unit 21 may be distributed between a portion of two adjacent second shift register units 31, and two first shift register units 21 may be distributed between another portion of two adjacent second shift register units 31.

In some other embodiments, the plurality of first shift register units 21 and the plurality of second shift register units 31 may be evenly distributed alternately in the second direction Y.

In one embodiment, the first gate driving circuit 20 may include N cascaded first shift register units 21. In the second direction Y, i first shift register units 21 may be disposed between any two adjacent second shift register units 31. i and N may both be positive integers, and i≤N. By distributing the plurality of first shift register units 21 and the plurality of second shift register units 31 evenly and alternately in the second direction Y, the distances between each row of the plurality of pixel circuits 10 and the first shift register units 21 electrically connected to the row of the plurality of pixel circuits 10 in the second direction Y may tend to be same, and the distances between each row of the plurality of pixel circuits 10 and the second shift register units 31 electrically connected to the row of the plurality of pixel circuits 10 in the second direction Y may tend to be same. Correspondingly, for each row of the plurality of pixel circuits 10, the voltage drop and signal delay caused by the connection wiring between each row of the plurality of pixel circuits 10 and the first shift register units 21 electrically connected to the row of the plurality of pixel circuits 10 may tend to be the same, and the voltage drop and signal delay caused by the connection wiring between each row of the plurality of pixel circuits 10 and the second shift register units 31 electrically connected to the row of the plurality of pixel circuits 10 may tend to be the same, which may improve display uniformity.

Figure 9:
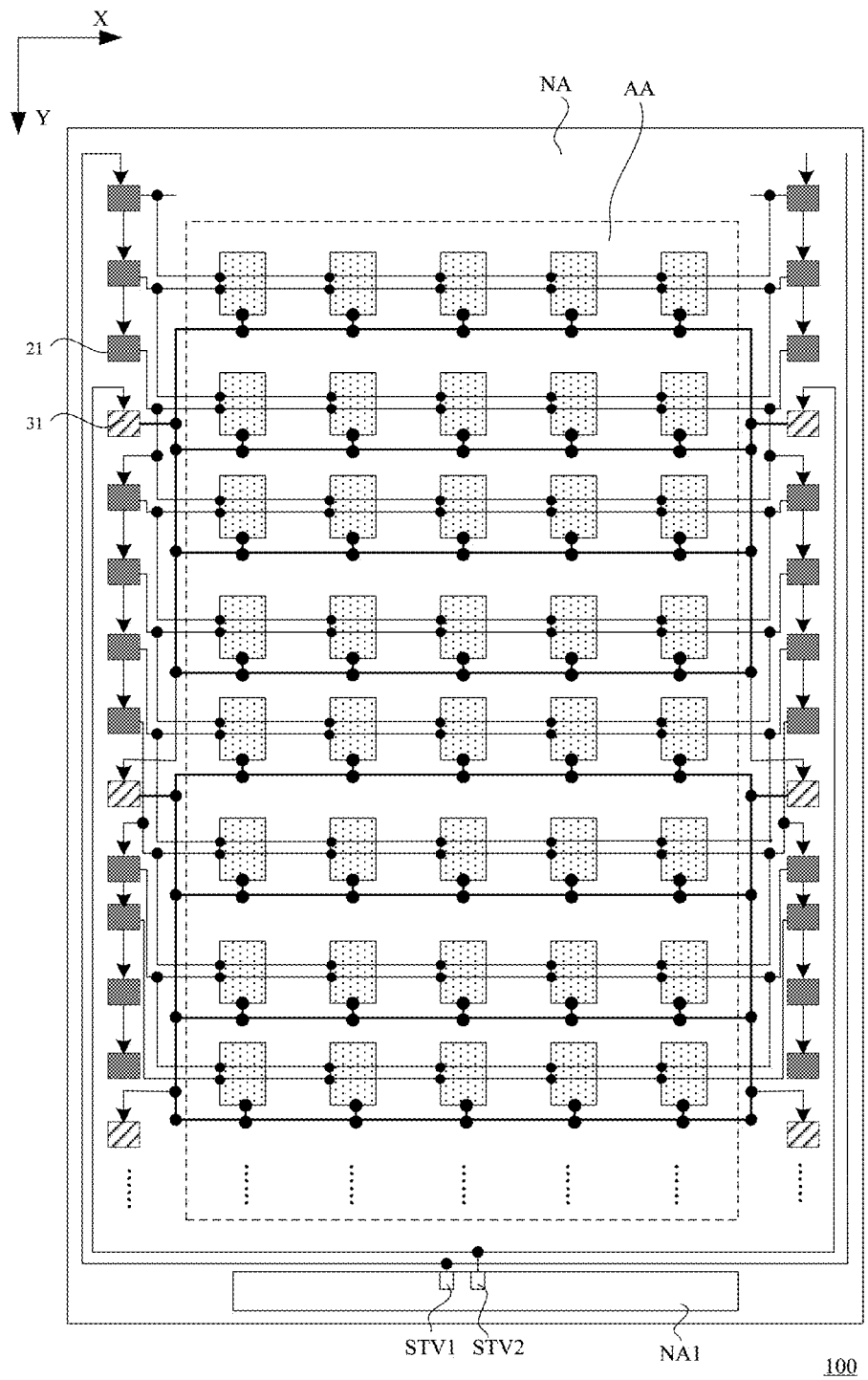
FIG. 9 illustrates a top view of another exemplary array substrate consistent with various disclosed embodiments in the present disclosure.

The first shift register unit 21 can be used to provide a scanning signal to the pixel circuit 10, and the second shift register unit 31 can be used to provide a light-emitting control signal to the pixel circuit 10. The first-stage second shift register unit 31 may be electrically connected to multiple rows of pixel circuits 10 to control the multiple rows of pixel circuits 10 to emit light. In some alternative embodiments, as shown in FIG. 8, i can be 2, and there can be two first shift register units 21 distributed between any two adjacent second shift register units 31. The two shift register units 31 can be electrically connected to the two rows of pixel circuits 10. Or, as shown in FIG. 9, i can be 4, and there can be 4 first shift register units 21 distributed between any two adjacent second shift register units 31, and the second shift register units 31 can be The four rows of pixel circuits 10 are electrically connected. By arranging the one-stage second shift register unit 31 to be electrically connected to the multi-row pixel circuits 10, the number of the second shift register units 31 can be reduced, so that the second gate driving circuit 30 can be reduced in the second direction Y. In this way, the size of the non-display area of the array substrate in the second direction Y can be reduced. To reduce the size of the non-display area of the array substrate in the second direction Y, in some optional embodiments, the length of the first shift register unit 21 in the second direction Y may be smaller than that of the pixel circuit 10 in the second direction. The length in Y, and/or the length of the second shift register unit 31 in the second direction Y may be less than the length of the pixel circuit 10 in the second direction Y.

The plurality of first shift register units 21 may be used to provide scanning signals to the plurality of pixel circuits 10, and the plurality of second shift register units 31 may be used to provide light-emitting control signals to the plurality of pixel circuits 10. Each stage of the plurality of second shift register units 31 may be electrically connected to multiple rows of the plurality of pixel circuits 10, to control the multiple rows of the plurality of pixel circuits 10 to emit light.

In some alternative embodiments, as shown in FIG. 8, i may be 2, and there may be two first shift register units 21 distributed between any two adjacent second shift register units 31. Each shift register unit 31 may be electrically connected to two rows of the plurality of pixel circuits 10. Or, as shown in FIG. 9, i may be 4, and there may be 4 first shift register units 21 distributed between any two adjacent second shift register units 31, and each second shift register units 31 may be electrically connected to four rows of the plurality of pixel circuits 10. By electrically connected one stage second shift register unit 31 to the multiple rows of the plurality of pixel circuits 10, the number of the plurality of second shift register units 31 may be reduced, such that the space occupied by the second gate driving circuit 30 in the second direction Y may be reduced. Correspondingly, the size of the non-display area of the array substrate in the second direction Y may be reduced.

To reduce the size of the non-display area of the array substrate in the second direction Y, in some optional embodiments, the length of each first shift register unit 21 in the second direction Y may be smaller than the length of each of the plurality of pixel circuits 10 in the second direction Y, and/or the length of each second shift register unit 31 in the second direction Y may be less than the length of each of the plurality of pixel circuits 10 in the second direction Y.

It can be understood that the orthographic projection of one first shift register unit 21 of the plurality of first shift register units 21 on the plane of the array substrate may not be a regular rectangle. Exemplarily, the length of the first shift register unit 21 in the second direction Y may be a largest distance of two opposite edges of its orthographic projection on the plane of the array substrate in the second direction Y. The first shift register unit 21 may include multiple components. For example, the components may include transistors or capacitors. The orthographic projection of the first shift register unit 21 on the plane of the array substrate may be the orthographic projection of the multiple components included in the first shift register unit 21 on the plane of the array substrate. In the same way, the length of one second shift register unit 31 of the plurality of second shift register units 31 in the second direction Y may be a largest distance of two opposite edges of its orthographic projection on the plane of the array substrate in the second direction Y, and the length of one pixel circuit 10 of the plurality of pixel circuits 10 in the second direction Y may be a largest distance of two opposite edges of its orthographic projection on the plane of the array substrate in the second direction Y.

When the plurality of first shift register units 21 and the plurality of second shift register units 31 are evenly and alternately distributed in the second direction Y, the size of the plurality of first shift register units 21 or the size of the plurality of second shift register units 31 in the second direction Y may be compressed, to prevent the non-display area of the array substrate in the second direction from occupying a large space. In some optional embodiments, there may be two first shift register units 21 distributed between any two adjacent second shift register units 31, and each second shift register unit 31 may be electrically connected to two rows of the plurality of pixel circuits 10. That is, each second shift register unit 31 may be used to drive two rows of the plurality of pixel circuits 10. The number of the plurality of first shift register units 21 may be larger than or equal to the number of rows of the plurality of pixel circuits 10. For example, the difference between the number of the plurality of first shift register units 21 and the number of the rows of the plurality of pixel circuit 10 may be 1. The total length of two adjacent first shift register units 21 and one second shift register unit 31 in the second direction Y may be a first length, and the total length of two adjacent pixel circuits 10 of the plurality of pixel circuits 10 in the second direction Y may be a second length. The first length and the second length may be the same. Since the first length and the second length may be the same, even if the first gate driving circuit 20 and the second gate driving circuit 30 are arranged in a same row, a length of the space occupied by the first gate driving circuit 20 and the second gate driving circuit 30 in the second direction Y may be approximately equal to the length of the display area AA in the second direction Y, such that the non-display area of the array substrate in the second direction may be prevented from occupying a large space.

Similarly, when there are four first shift register units 21 distributed between any two adjacent second shift register units 31, each second shift register unit 31 may be electrically connected to four rows of the plurality of pixel circuits 10. That is, each second shift register unit 31 may be used to drive four rows of the plurality of pixel circuits 10. The number of the plurality of first shift register units 21 may be larger than or equal to the number of rows of the plurality of pixel circuits 10. The total length of four adjacent first shift register units 21 and one second shift register unit 31 in the second direction Y may be a third length, and the total length of four adjacent pixel circuits 10 of the plurality of pixel circuits 10 in the second direction Y may be a fourth length. The third length and the fourth length may be the same. Since the third length and the fourth length may be the same, even if the first gate driving circuit 20 and the second gate driving circuit 30 are arranged in a same row, a length of the space occupied by the first gate driving circuit 20 and the second gate driving circuit 30 in the second direction Y may be approximately equal to the length of the display area AA in the second direction Y, such that the non-display area of the array substrate in the second direction may be prevented from occupying a large space.

To ensure the performance of the plurality of first shift register units 21 and the plurality of second shift register units 31, based on the current technology level, the size of the plurality of first shift register units 21 and the plurality of second shift register units 31 cannot be infinitely compressed. In some optional embodiments, when the plurality of first shift register units 21 and the plurality of second shift register units 31 are evenly and alternately distributed in the second direction Y, there may be two first shift register units 21 distributed between any two adjacent second shift register units 31, and each second shift register unit 31 may be electrically connected to two rows of the plurality of pixel circuits 10. That is, each second shift register unit 31 may be used to drive two rows of the plurality of pixel circuits 10. A length-width ratio of each of the plurality of first shift register units 21 may be about 4.5:1 to about 5.5:1, and a length-width ratio of each of the plurality of second shift register units 31 may be about 4.2:1 to about 5.2:1. Optionally, in one embodiment, the length-width ratio of each of the plurality of first shift register units 21 may be about 5.0:1, and the length-width ratio of each of the plurality of second shift register units 31 may be about 4.7:1.

In another embodiment, when the plurality of first shift register units 21 and the plurality of second shift register units 31 are evenly and alternately distributed in the second direction Y, there may be four first shift register units 21 distributed between any two adjacent second shift register units 31, and each second shift register unit 31 may be electrically connected to four rows of the plurality of pixel circuits 10. That is, each second shift register unit 31 may be used to drive four rows of the plurality of pixel circuits 10. A length-width ratio of each of the plurality of first shift register units 21 may be about 4.2:1 to about 5.2:1, and a length-width ratio of each of the plurality of second shift register units 31 may be about 4.0:1 to about 5.0:1. Optionally, in one embodiment, the length-width ratio of each of the plurality of first shift register units 21 may be about 4.8:1, and the length-width ratio of each of the plurality of second shift register units 31 may be about 4.6:1.

By using the length-width ratio of each of the plurality of first shift register units 21 and the length-width ratio of each of the plurality of second shift register units 31 described above, the size of the non-display area in the display panel and the width of the edge non-display area maybe reduce, and the driving performance of the plurality of first shift register units 21 and the plurality of second shift register units 31 may also be ensured. Further, it may be achieved under the current technological level.

The length-width ratio of one first shift register unit 21 of the plurality of first shift register units 21 may be a ratio between the length of the first shift register unit 21 in the first direction X and the length of the first shift register unit 21 in the second direction Y. The length-width ratio of one second shift register unit 31 of the plurality of second shift register units 31 may be a ratio between the length of the second shift register unit 31 in the first direction X and the length of the second shift register unit 31 in the second direction Y.

As described above, the orthographic projection of one first shift register unit 21 of the plurality of first shift register units 21 on the plane of the array substrate may not be a regular rectangle. Exemplarily, the length of the first shift register unit 21 in the second direction Y may be a largest distance of two opposite edges of its orthographic projection on the plane of the array substrate in the second direction Y, and the length of the first shift register unit 21 in the first direction X may be a largest distance of two opposite edges of its orthographic projection on the plane of the array substrate in the first direction X. In the same way, the length of one second shift register unit 31 of the plurality of second shift register units 31 in the second direction Y may be a largest distance of two opposite edges of its orthographic projection on the plane of the array substrate in the second direction Y, and the length of one second shift register unit 31 of the plurality of second shift register units 31 in the first direction X may be a largest distance of two opposite edges of its orthographic projection on the plane of the array substrate in the first direction X.

In one embodiment, the length of the first shift register unit 21 in the first direction X may be configured to be equal to the length of the second shift register unit 31 in the first direction X. Correspondingly, the size in the first direction X occupied by the first shift register unit 21 and the second shift register unit 31 may be same, which may be beneficial to achieve the display panel with the large screen-to-body ratio.

In some embodiments, the total number of transistors and capacitors in each first shift register unit 21 may be less than the total number of transistors and capacitors in each second shift register unit 31. Correspondingly, the length of the first shift register unit 21 in the second direction Y may be less than the length of the second shift register unit 31 in the second direction Y. In some other embodiments, the total number of transistors and capacitors in the first shift register unit 21 may be larger than or equal to the total number of transistors and capacitors in the second shift register unit 31. Correspondingly, the length of the first shift register unit 21 in the second direction Y may be larger than or equal to the length of the second shift register unit 31 in the second direction Y. That is to say, one of the first shift register unit 21 and the second shift register unit 31 where the total number of components included in is larger may have a larger length in the second direction Y. Further, the length of the first shift register unit 21 in the first direction X and the length of the second shift register unit 31 in the first direction X may be equal, to prevent the one of the first shift register unit 21 and the second shift register unit 31 with the larger total number of components from being compressed too severely, thereby avoiding problems that may affect its performance.

Figure 10:
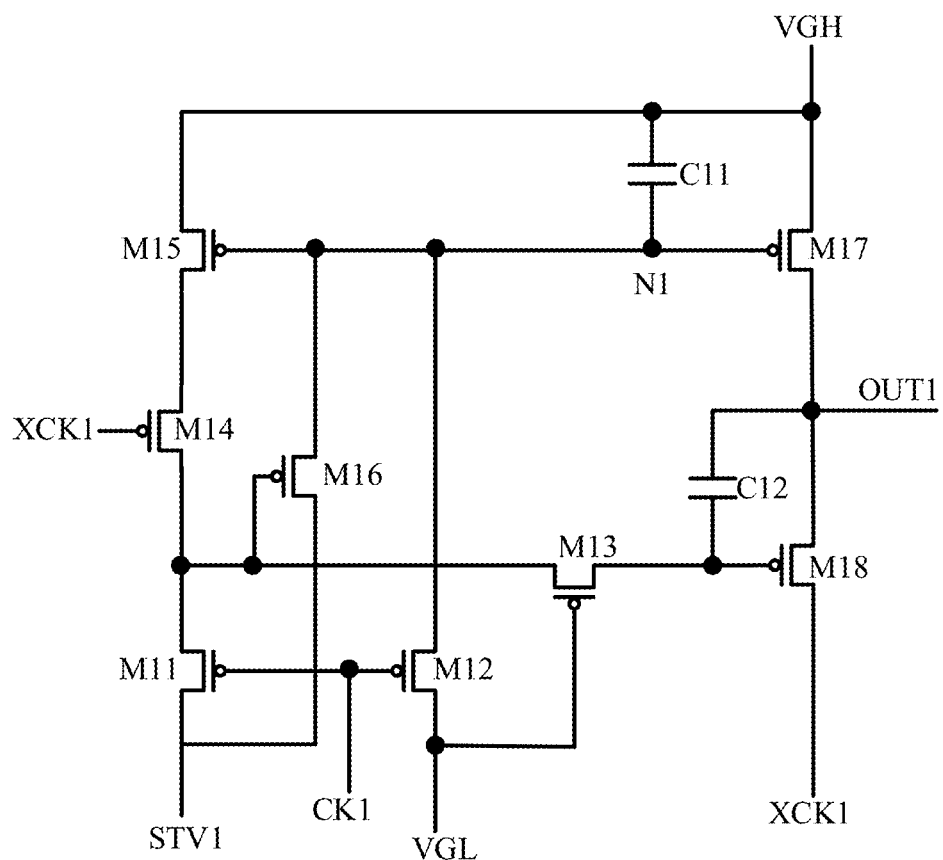
FIG. 10 illustrates a circuit structure of a first shift register unit in an exemplary array substrate consistent with various disclosed embodiments in the present disclosure.
Figure 11:
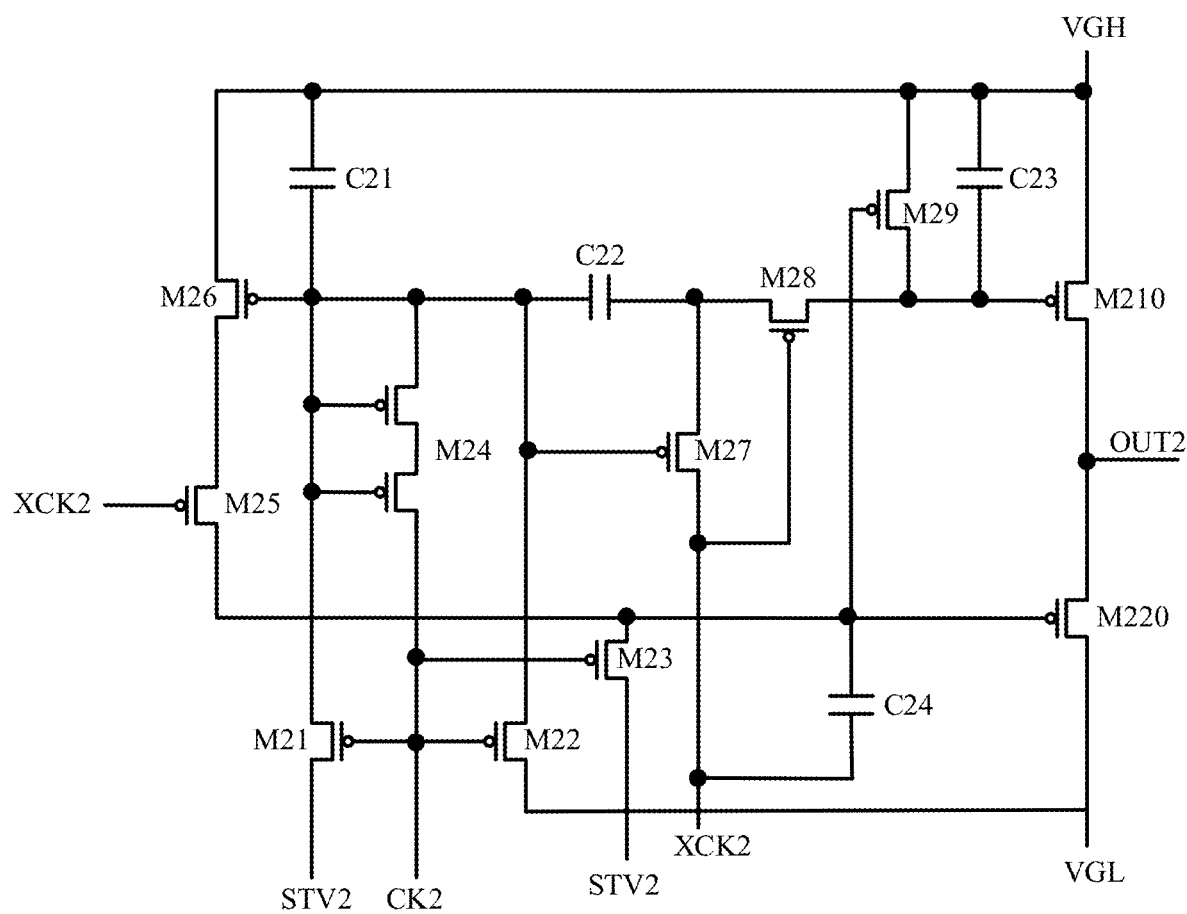
FIG. 11 illustrates a circuit structure of a second shift register unit in an exemplary array substrate consistent with various disclosed embodiments in the present disclosure.

In some embodiments, the total number of components in each first shift register unit 21 may be less than the total number of components in each second shift register unit 31. For example, the first shift register unit 21 may be used to provide scan signals, and the second shift register unit 31 may be used to provide light-emitting control signals. As shown in FIGS. 10 and 11, the first shift register unit 21 may include 8 transistors and 2 capacitors, the second shift register unit 31 may include 11 transistors and 4 capacitors.

As shown in FIG. 8 or FIG. 9, the non-display area NA of the array substrate 100 may include a binding area NA1. The binding area NA1 may be provided with a first trigger signal terminal STV1 and a second trigger signal terminal STV2. The first trigger signal terminal STV1 may be electrically connected to the first stage first shift register unit 21 for providing a trigger signal to the first stage first shift register unit 21. Except for the last stage first shift register unit 21, the signal output from the output terminal of the k-th stage first shift register unit 21 may be used as the trigger signal of the (k+1)-th stage first shift register unit 21. The second trigger signal terminal STV2 may be electrically connected to the first stage second shift register unit 31 for providing a trigger signal to the first-stage second shift register unit 31. Except for the last stage second shift register unit 31, the signal output from the output terminal of the k-th stage second shift register unit 31 may be used as the trigger signal of the (k+1)-th stage second shift register unit 31. k may be a positive integer.

Figure 12:
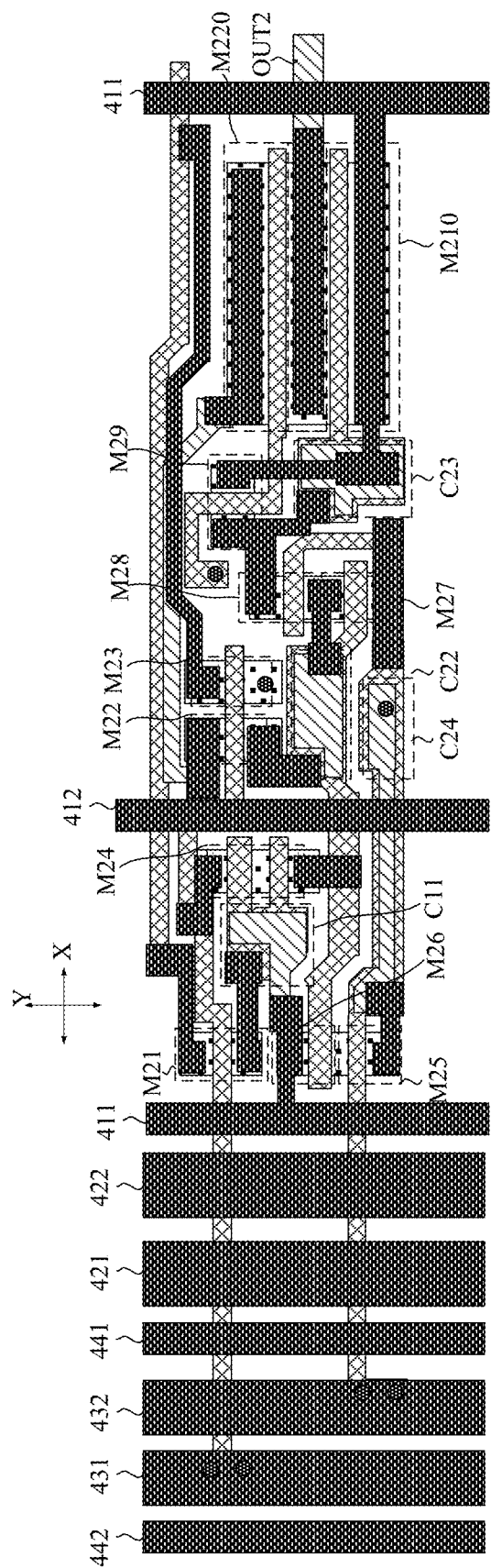
FIG. 12 illustrates a layout of a second shift register unit in an exemplary array substrate consistent with various disclosed embodiments in the present disclosure.

In some optional embodiments, the plurality of second shift register units 31 may be used to provide light-emitting control signals to the plurality of pixel circuits 10. As shown in FIG. 11 and FIG. 12, one second shift register unit 31 of the plurality of second shift register units 31 may include a first output transistor M210 and a second output transistor M220. The first output transistor M210 and the second output transistor M220 may be all electrically connected to the output terminal OUT2 of the second shift register unit 31. The first output transistor M210 and the second output transistor M220 may be disposed along the second direction Y are arranged and adjacent to each other in the second direction Y. Taking the second direction Y as the column direction as an example, it can be understood that the first output transistor M210 and the second output transistor M220 may be located in the same column.

Exemplarily, as shown in FIG. 11, the second shift register unit 31 may further include transistors M21, M22, M23, M24, M25, M26, M27, M28, M21, M29 and capacitors C21, C22, C23, C24. The connection mode of each transistor and capacitor is shown in FIG. 11, which will not be described in detail here. It is understandable that, for the second shift register unit 31 of other stages except for the first stage second shift register unit 31, the second trigger signal terminal STV2 in FIG. 11 may be the output terminal OUT2 of the second shift register unit 31 of the previous stage.

As shown in FIG. 11, VGH represents the first fixed signal terminal, and VGL represents the second fixed signal terminal. The first fixed signal terminal VGH may provide a high-level signal, such as +8V or +7V. The second fixed signal terminal VGL may provide a low-level signal, such as −8V or −7V. STV2 represents the second trigger signal terminal. Except for the last stage second shift register unit 31, the output terminal OUT2 of each of the second shift register units 31 of other stages may be used as the second trigger signal terminal of the second shift register unit 31 of the next stage. CK2 and XCK2 may represent two clock signal terminals, and CK2 and XCK2 may be used to provide clock signals to the second shift register unit 31.

In a transistor, when a width-to-length ratio of a channel is larger, the driving capability of the transistor may be stronger. Therefore, the width-to-length ratio of the channel in the first output transistor M210 and the second output transistor M220 connected to the output terminal of the second shift register unit 31 may be set to be larger than the width-to-length ratio of channels in other transistors. Therefore, the area occupied by the first output transistor M210 and the second output transistor M220 may be larger than the area occupied by other transistors. In the present disclosure, the first output transistor 210 and the second output transistors M220 may be arranged in the same column. In comparison with the case where the first output transistor 210 and the second output transistors M220 are arranged in two columns, the space occupied by the first output transistor M210 and the second output transistor M220 in the first direction X may be reduced. Therefore, the width of the non-display area of the array substrate in the first direction X may be reduced, which is more beneficial to increase the screen-to-body ratio of the display panel.

In one embodiment, lengths and width of channels in the first output transistor M201 and the second output transistor M220 may be same.

In some optional embodiments, the orthographic projection of the first output transistor M210 on the plane of the array substrate and the orthographic projection of the second output transistor M220 on the plane of the array substrate in the second direction Y may overlap with each other. Exemplarily, the maximum distance in the first direction X between two opposite edges of the orthographic projection of the first output transistor M210 on the plane of the array substrate may be the same as the maximum distance in the first direction X between two opposite edges of the orthographic projection of the second output transistor M220 on the plane of the substrate in the first direction X. Further, the first output transistor M210 and the second output transistor M220 may be arranged in the second direction Y without misalignment. Exemplarily, within the allowable process error range, the orthographic projections of the first output transistor M210 and the second output transistor M220 on the plane of the array substrate may be regarded as overlapping in the second direction Y. In this way, the space occupied by the first output transistor M210 and the second output transistor M220 in the first direction X may be further reduced, thereby further reducing the width of the non-display area of the array substrate in the first direction X, which is more beneficial to improving the screen-to-body ratio of the display panel.

In one embodiment, as shown in FIG. 11, the first direction X may be the row direction and the second direction Y may be the column direction as an example. The transistors M21, M26, and M25 may be arranged in a row in the second direction Y. The transistors M27 and M28 may be arranged in a row in the second direction Y. The transistors M22 and M23 may be distributed in a row in the first direction X. In the first direction X, the transistor M24 may be located between the transistor M22 and the transistor M26, the capacitor C21 may be located between the transistor M24 and the transistor M26, the transistor M29 may be located between the transistor M28 and the transistor M220, and the capacitor C23 may be located between the transistor M210 and the transistor M27. In the second direction Y, the capacitor C22 may be located between the capacitor C24 and the transistors M22 and M23. The embodiment shown in FIG. 11 is used only as an example to illustrate the present disclosure, and does not limit the scope of the present disclosure.

Figure 13:
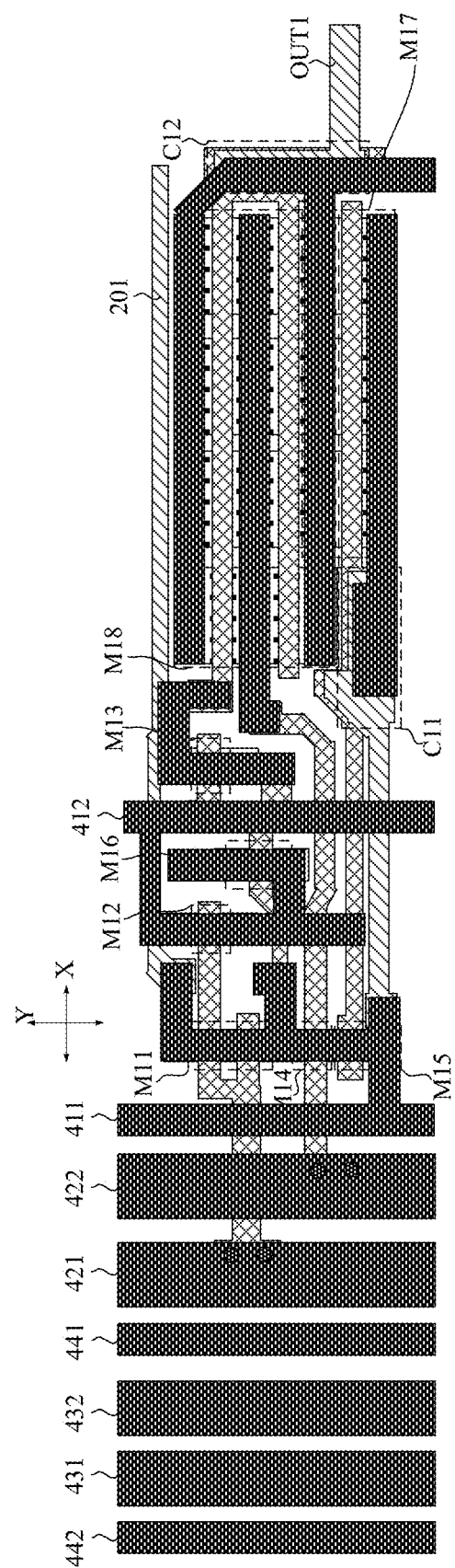
FIG. 13 illustrates a layout of a first shift register unit in an exemplary array substrate consistent with various disclosed embodiments in the present disclosure.

In some embodiments, as shown in to FIG. 10 and FIG. 13, one first shift register unit 21 of the plurality of first shift register units 21 may include a third output transistor M17 and a first capacitor C11. A source or drain of the third output transistor M17 may be electrically connected to the output terminal OUT1 of the first shift register unit 21. A plate of the first capacitor C11 may be electrically connected to a gate of the third output transistor M17, and the first capacitor C11 may be located on a side of the third output transistor M17 away from the display area AA.

Exemplarily, as shown in FIG. 10, the first shift register unit 21 may also include transistors M11, M12, M13, M14, M15, M16, M18, and a capacitor C12. M11 may be the first input transistor, M18 may be the fourth output transistor, and M16 may be the first node control transistor. The connection mode of each transistor and capacitor is shown in FIG. 10, which will not be described in detail here. It should be understood that, for each of the first shift register units 21 of other stages except the first stage first shift register unit 21, the first trigger signal terminal STV1 in FIG. 10 may be the output terminal OUT1 of the first shift register unit 21 of the previous stage.

As shown in FIG. 11, VGH represents the first fixed signal terminal, and VGL represents the second fixed signal terminal. The first fixed signal terminal VGH may provide a high-level signal, such as +8V or +7V. The second fixed signal terminal VGL may provide a low-level signal, such as −8V or −7V. STV1 represents the first trigger signal terminal. Except for the last stage first shift register unit 21, the output terminal OUT1 of each of the first shift register units 21 of other stages may be used as the first trigger signal terminal of the first shift register unit 21 of the next stage. CK1 and XCK1 may represent two clock signal terminals, and CK1 and XCK1 may be used to provide clock signals to the first shift register unit 31.

As shown in FIG. 13, the first shift register unit 21 may include a plurality of transistors. To facilitate the connection between the output terminal OUT1 of the first shift register unit 21 and corresponding pixel circuits 10 of the plurality of pixel circuits 10 in the display area AA, the output transistor of the first shift register unit 21 may be arranged close to the display area, and other transistors may be arranged on a side of the output transistor of the first shift register unit 21 away from the display area AA. In the present disclosure, by arranging the first capacitor C11 at a side of the third output transistor M17 away from the display area AA, in the first direction X, the first capacitor C11 may be located between the third output transistor M17 and other transistors. For example, in the first direction X, the first capacitor C11 may be located between the third output transistor M17 and the transistor M5. In comparison with a case where the first capacitor 11 is located at a side of the third output transistor M17 close to the display area AA, the first capacitor C11 may be accommodated without increasing the size of the first shift register unit 21 in the first direction X, thereby reducing the width of the non-display area of the array substrate in the first direction X, which is more conducive to improving the screen-to-body ratio of the display panel.

In some embodiments, as shown in FIG. 10 and FIG. 13, the first shift register unit 21 may include a first node control transistor M16, a first input transistor M11, and a fourth output transistor M18. A first electrode of the fourth output transistor M18 may be electrically connected to the output terminal OUT1 of the first shift register unit 21, and a second electrode of the fourth output transistor M18 may be electrically connected to the clock signal terminal. Except for the first stage first shift register unit 21, in each of the first shift register units 21 of other stages, a first electrode of the first node control transistor M16 may be electrically connected to the output terminal of the first shift register unit of the previous stage, a second electrode of the first node control transistor M16 in each of the first shift register units 21 of other stages may be electrically connected to a gate of the third output transistor M17, a gate of the first node control transistor M16 may be coupled to the gate of the fourth output transistor M18 and the second electrode of the first input transistor M11. Except for the first stage first shift register unit 21, in each of the first shift register units 21 of other stages, a first electrode of the first input transistor M11 may be electrically connected to the output terminal of the first shift register unit of the previous stage, and a second electrode of the first input transistor M11 may be coupled to a gate of the fourth output transistor M18.

As shown in FIG. 13, since the first electrode of the first node control transistor M16 and the first electrode of the first input transistor M11 may be both electrically connected to the output terminal of the first shift register unit 21 of the previous stage, the first node control transistor M16 and the first input transistor M11 may share a cascade wiring to realize the electrical connection with the output terminal of the first shift register unit of the previous stage. The number of cascade wiring may be reduced, to optimize the wiring space and improve the screen-to-body ratio of the display panel.

Figure 14:
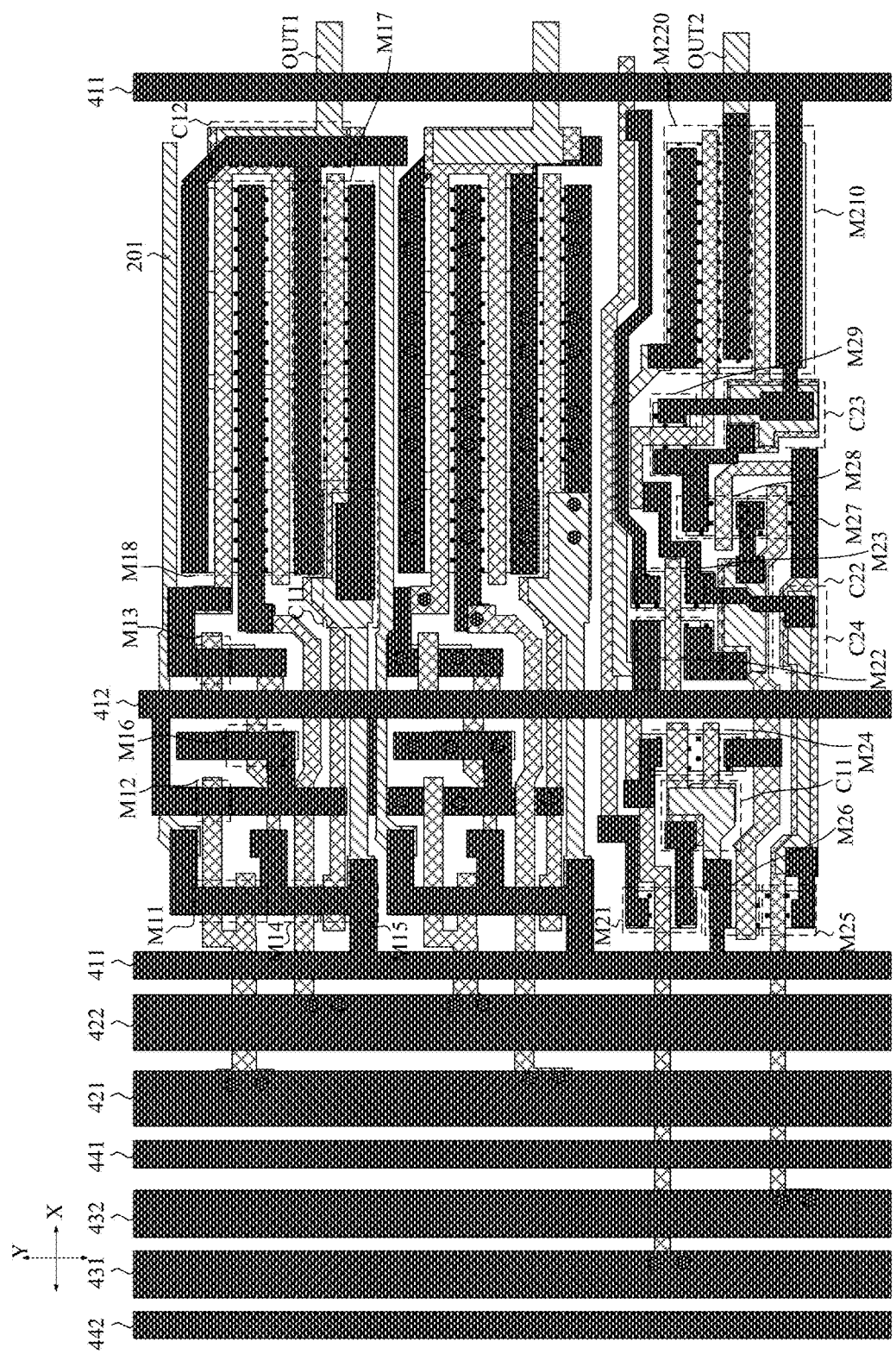
FIG. 14 illustrates a layout of two first shift register units and a second shift register unit in an exemplary array substrate consistent with various disclosed embodiments in the present disclosure.

In some embodiments, as shown in FIG. 14, in the (j+1)-th stage first shift register unit 21, the first electrode of the first node control transistor M16 and the first electrode of the first input transistor M11 may be electrically connected to the output terminal OUT1 of the j-th stage first shift register unit 21 through a cascade wiring 201. The cascade wiring 201 may extend along the first direction X, and may be located between the j-th stage first shift register unit 21 and the (j+1)-th stage first shift register unit 21, where j is a positive integer.

Exemplarily, the output terminal OUT1 of the first shift register unit 21 may be located on a side of the first shift register unit 21 close to the display area, and the first node control transistor M16 and the first input transistor M11 in the first shift register unit 21 may be located far away from another side of the first shift register unit 21 away from the display area. There may be no overlap between the cascade wiring 201 and other non-fixed potential signal lines.

In the embodiments of the present disclosure, the first node control transistor M16 and the first input transistor M11 may share a cascade wiring 201. In comparison to a case using two cascade wirings to connect the first node control transistor M16 and the first input transistor M11, the number of cascaded wirings may be reduced, which may be beneficial to increase the screen-to-body ratio of the display panel. Further, by disposing only one cascade wiring, it may be easier to avoid overlapping between the cascade wiring 201 and other non-fixed potential signal lines, thereby avoiding coupling and ensuring the stability of the signal on the cascade wiring 201.

In some embodiments, as shown in FIG. 14, the array substrate may further include first fixed potential signal lines 411 and second fixed potential signal lines 412 extending along the second direction Y. The plurality of first shift register units 21 and the plurality of second shift register units 22 may share the first fixed potential signal lines 411 and the second fixed potential signal lines 412. The first fixed potential signal lines 411 may be used to transmit a high-level signal. For example, the first fixed potential signal lines 411 may be electrically connected to the first fixed signal terminal VGH. The second fixed potential signal lines 412 may be used to transmit low-level signals. For example, the second fixed potential signal lines 412 may be electrically connected to the second fixed signal terminal VGL. In comparison to other cases where two first fixed potential signal lines 411 are disposed to electrically connect the plurality of first shift register units 21 and the plurality of second shift register units 22 respectively, or two second fixed potential signal lines 412 are disposed to electrically connect the plurality of first shift register units 21 and the plurality of second shift register units 22 respectively, the number of the first fixed potential signal lines 411 and the second fixed potential signal lines 412 may be reduced, thereby further increasing the screen-to-body ratio of the display panel.

Exemplarily, an orthographic projection of the second fixed potential signal lines 412 on the plane of the array substrate may overlap with the orthographic projection of the plurality of first shift register units 21 and the plurality of second shift register units 22 on the plane of the array substrate. An orthographic projection of the second fixed potential signal lines 412 on the plane of the array substrate may not overlap with the orthographic projection of the plurality of first shift register units 21 and the plurality of second shift register units 22 on the plane of the array substrate. Exemplarily, at least one first fixed-potential signal line 411 may be arranged on a side of the plurality of first shift register units 21 and the plurality of second shift register units 22 away from the display area.

Exemplarily, as shown in FIG. 14, the array substrate 100 may further include clock signal lines 421, 422, 431, and 432, and trigger signal lines 441 and 442. The clock signal lines 421 and 422 may be electrically connected to the plurality of first shift register units 21, and the clock signal lines 431 and 432 may be electrically connected to the plurality of second shift register units 31. The clock signal line 421 may be electrically connected to the clock signal terminal CK1, the clock signal line 422 may be electrically connected to the clock signal terminal XCK1, the clock signal line 431 may be electrically connected to the clock signal terminal CK2, and the clock signal line 432 may be electrically connected to the clock signal terminal XCK2. The trigger signal line 441 may be electrically connected to the first stage first shift register unit 21 and the first trigger signal terminal STV1, and the trigger signal line 442 may be electrically connected to the first stage second shift register unit 31 and the second trigger signal terminal STV2.

Figure 15:
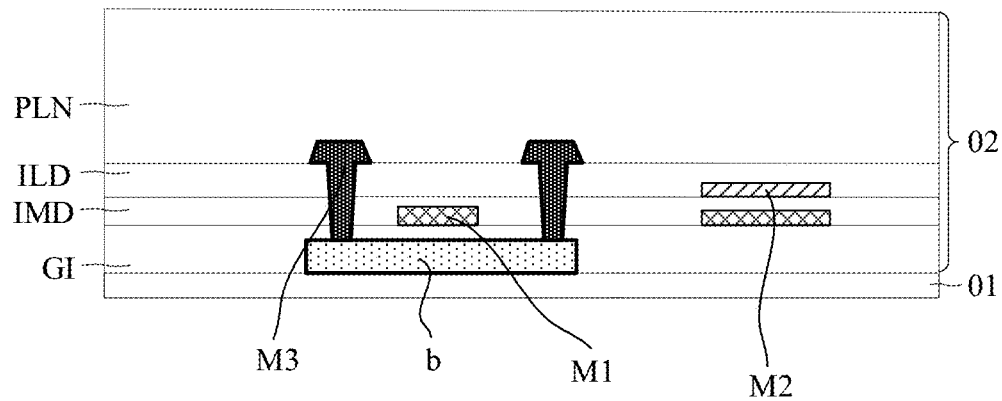
FIG. 15 illustrates a film layer structure of an exemplary array substrate consistent with various disclosed embodiments in the present disclosure.

Exemplarily, the array substrate 100 may include a substrate 01 and a driving device layer 02 at a side of the substrate 10. The plurality of pixel circuits 10, the first gate driving circuit 21, the second gate driving circuit 20, and the signal lines may be arranged in the driving device layer 02. For example, in one embodiment, transistors of the array substrate may be polysilicon transistors. The driving device layer 02 may include a first metal layer M1, a second metal layer M2, and a third metal layer M3 that are stacked with each other. The driving device layer 02 may also include a semiconductor layer b, a gate insulating layer GI, a capacitor insulating layer IMD, an interlayer dielectric layer ILD, and a planarization layer PLN. The position relationship between different film layers is shown in FIG. 15, which will not be described in detail here.

Optionally, in the plurality of pixel circuits 10, the first gate driving circuit 21, and the second gate driving circuit 20, an active layer of each transistor may be disposed in the semiconductor layer b, a gate of each transistor may be disposed in the first metal layer M1, a source and/or drain of each transistor may be disposed in the third metal layer M3. In the plurality of pixel circuits 10, the first gate driving circuit 21, and the second gate driving circuit 20, at least one electrode plate of each capacitor may be disposed in the second metal layer M2. At least one of the first fixed potential signal line 411, the second fixed potential signal line 412, the clock signal lines 421, 422, 431, 432, and the trigger signal lines 441, 442 may be disposed in the third metal layer M3. The above embodiment is used as an example only to illustrate the present disclosure, and does not limit the scope of the present disclosure.

Figure 16:
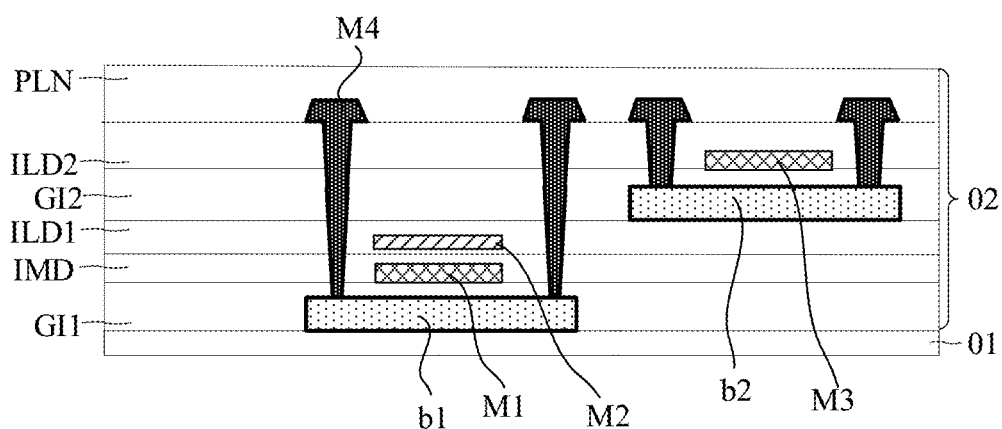
FIG. 16 illustrates a film layer structure of another exemplary array substrate consistent with various disclosed embodiments in the present disclosure.

To ensure that the array substrate has better driving performance and lower leakage current, the array substrate may include low-temperature polysilicon transistors and oxide transistors. As shown in FIG. 16, the difference between FIG. 16 and FIG. 15 is that the driving device layer 02 shown in FIG. 16 has an extra semiconductor layer and a metal layer in addition to the insulating layer. Specifically, as shown in FIG. 16, the driving device layer 02 may include a first semiconductor layer b1, a second semiconductor layer b2, stacked metal layers M1, M2, M3, M4, a first gate insulating layer GI1, a capacitor insulating layer IMD, and a second semiconductor layer b1. The positional relationship of the interlayer dielectric layer ILD1, the second gate insulating layer GI2, the second interlayer dielectric layer ILD2, and the planarization layer PLN can refer to FIG. 16, which will not be described in detail here.

Exemplarily, the active layer of each low-temperature polysilicon transistor in the array substrate may be disposed in the first semiconductor layer b1, the gate of each low-temperature polysilicon transistor may be disposed in the first metal layer M1, the source and/or drain of each low-temperature polysilicon transistor may be disposed in the fourth metal layer M4. The active layer of each oxide transistor in the array substrate may be disposed in the second semiconductor layer b2, the gate of each oxide transistor may be disposed in the third metal layer M3, and the source and/or drain of each oxide transistor may be disposed in the fourth metal layer M4. At least one electrode plate of each capacitor in the plurality of pixel circuits 10, the first gate driving circuit 21, and the second gate driving circuit 20 may be disposed in the second metal layer M2. At least one of the first fixed potential signal line 411, the second fixed potential signal line 412, the clock signal lines 421, 422, 431, 432, and the trigger signal lines 441, 442 may be disposed in the fourth metal layer M4, or at least one of the fixed-potential signal line 411, the second fixed-potential signal line 412, the clock signal lines 421, 422, 431, 432, and the trigger signal lines 441, 442 may be disposed in the third metal layer M3. The number of wires in one same metal layer may be reduced, therefore reducing the space occupied by wires in the same film layer and the overall width of the non-display area. The above embodiment is used as an example only to illustrate the present disclosure, and does not limit the scope of the present disclosure.

Figure 17:
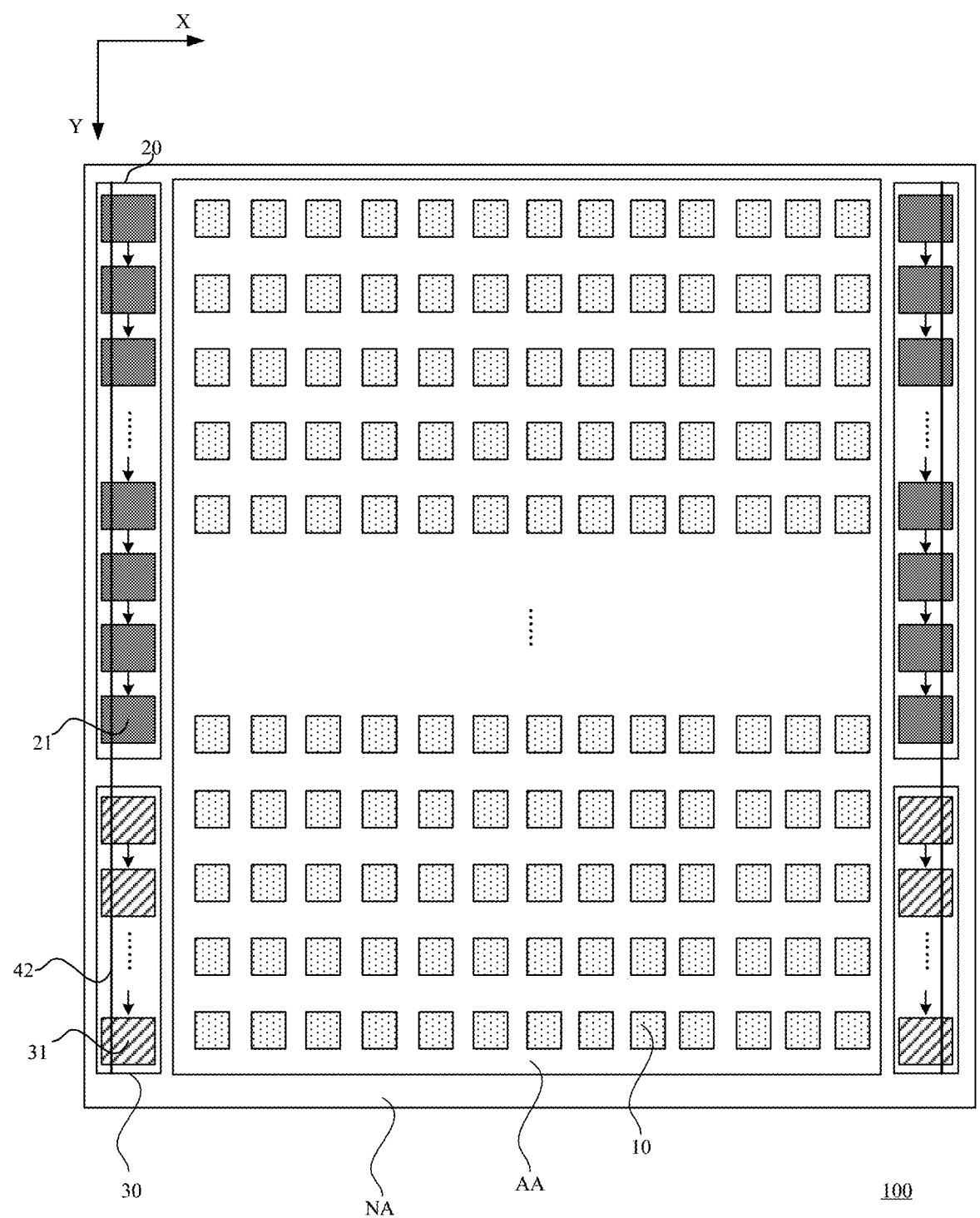
FIG. 17 illustrates a top view of another exemplary array substrate consistent with various disclosed embodiments in the present disclosure.

In the present disclosure, in comparison to an array substrate including only low-temperature polysilicon transistors, when the array substrate includes both low-temperature polysilicon transistors and oxide transistors, the metal film layers of the driving device layer 02 may be more, such that there may be more space in the thickness direction where the signal lines may be disposed. In some optional embodiments, as shown in FIG. 17, the array substrate may further include a first clock signal line 42. An orthographic projection of the first clock signal line 42 on the plane of the array substrate may overlap the orthographic projection of at least one of the first gate driving circuit 21 and the second gate driving circuits 31 on the plane of the array substrate. Compared with a case where the first clock signal line 42 and the first gate driving circuit 21 and/or the second gate driving circuit 31 do not overlap, the width of the non-display area of the array substrate may be further reduced, which is more conducive to improving the screen-to-body ratio of the display panel.

Figure 18:
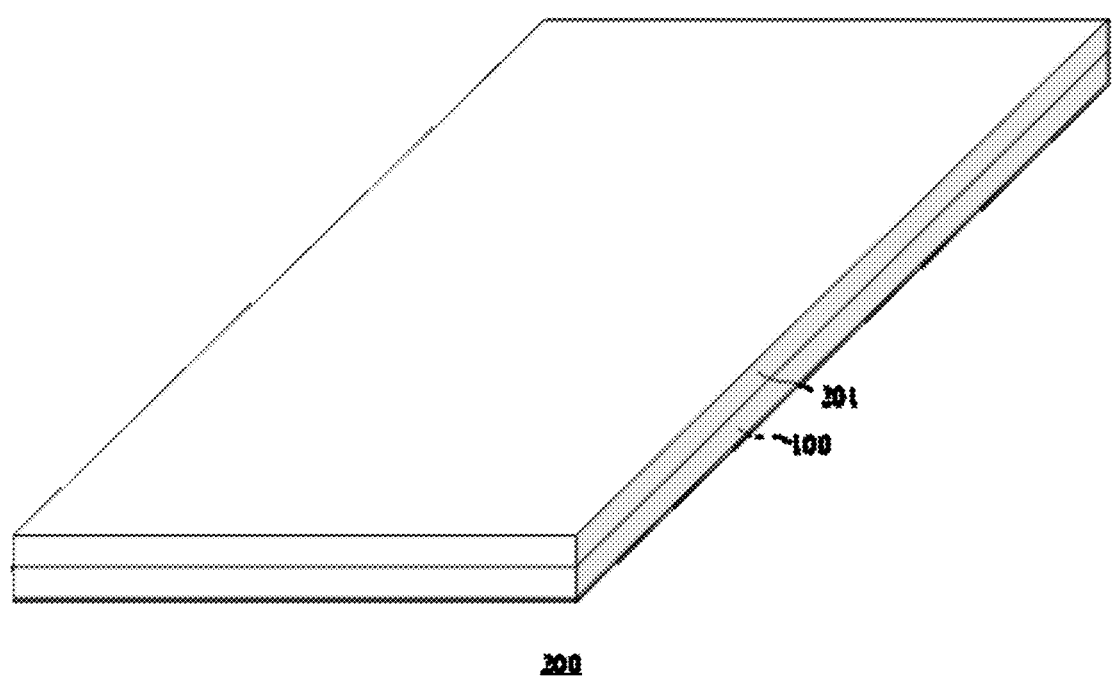
FIG. 18 illustrates an exemplary display panel consistent with various disclosed embodiments in the present disclosure.

The present disclosure also provides a display panel. The display panel may include any array substrate provided by various embodiments of the present disclosure. FIG. 18 shows a schematic structural diagram of a display panel provided by an embodiment of the present disclosure. As shown in FIG. 18, the display panel 200 may include an array substrate 100 provided by various embodiments of the present disclosure and a light-emitting layer 201 on the array substrate 100. Exemplarily, the light-emitting layer 201 may be an organic light-emitting layer, that is, the display panel 200 may be an organic light-emitting diode (OLED) display panel. The display panel provided by the embodiments of the present disclosure may have the beneficial effects of the array substrate provided by the embodiments of the present disclosure. For details, reference may be made to the specific description of the array substrate in the foregoing embodiments, and details are not described herein again in this embodiment.

Figure 19:
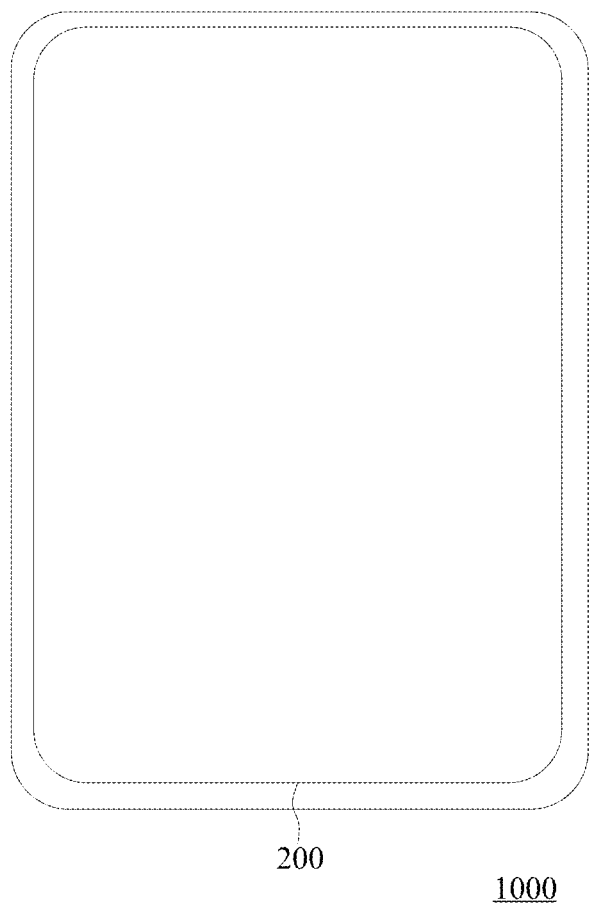
FIG. 19 illustrates an exemplary display device consistent with various disclosed embodiments in the present disclosure.

The present disclosure also provides a display device. The display device may include any array substrate provided by various embodiments of the present disclosure. As shown in FIG. 19 which is a schematic structural diagram of a display device provided by an embodiment of the present disclosure, the display device 1000 may include a display panel 200 provided by various embodiments of the present disclosure. The embodiment of FIG. 19 where the display device is a mobile phone is used as an example to illustrate the present disclosure, and does not limit the scope of the present disclosure. It is understandable that the display device in various embodiments may be a wearable product, a computer, a television, a vehicle display device, etc., with other display functions. The display device provided by the present disclosure may have the beneficial effects of the display panel provided by the present disclosure. For details, please refer to the specific description of the display panel in the foregoing embodiments, which will not be repeated in this embodiment.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. An array substrate with a display area and a non-display area surrounding the display area, comprising:
   a plurality of pixel circuits arranged in an array along a first direction and a second direction, wherein the plurality of pixel circuits are disposed in the display area and the first direction intersects the second direction;
   a first gate driving circuit in the non-display area, wherein the first gate driving circuit includes a plurality of first shift register units in cascade connection; and
   a second gate driving circuit in the non-display area, the second gate driving circuit and the first gate driving circuit being at a same side of the display area, wherein the second gate driving circuit includes a plurality of second shift register units in cascade connection,
   wherein:
   the first gate driving circuit and the second gate driving circuit are electrically connected to different transistors in the plurality of pixel circuits; and
   an orthographic projection of the first gate driving circuit on a plane of the array substrate at least partially overlaps with an orthographic projection of the second gate driving circuit on the plane of the array substrate along the second direction, and at least two of the plurality of first shift register units of the first gate driving circuit are adjacent to each other.

2. The array substrate according to claim 1, wherein:
   the first gate driving circuit includes a scan driving circuit; and
   the second gate driving circuit includes a light-emitting control driving circuit.

3. The array substrate according to claim 2, wherein:
   each pixel circuit of the plurality of pixel circuits includes first-type transistors and second-type transistors;
   each first shift register unit of the plurality of first shift register units includes a first-type shift register unit and a second-type shift register unit;
   one of the first-type shift register unit and the second-type shift register unit is electrically connected to the first-type transistors, and another one of the first-type shift register unit and the second-type shift register unit is electrically connected to the second-type transistors;
   the first-type transistors are N-type transistors;
   the second-type transistors are P-type transistors;
   an orthographic projection of the first-type shift register unit on the plane of the array substrate and an orthographic projection of the second-type shift register unit on the plane of the array substrate have no overlap in the second direction; and
   the orthographic projection of the second gate driving circuit on the plane of the array substrate and an orthographic projection of one of the first-type shift register unit and the second-type shift register unit on the plane of the array substrate overlap along the second direction.

4. The array substrate according to claim 2, wherein:
each second shift register unit of the plurality of second shift register units includes a first output transistor and a second output transistor;
the first output transistor and the second output transistor are both electrically connected to an output terminal of the second shift register unit; and
the first output transistor and the second output transistor are arranged and adjacent along the second direction.

5. The array substrate according to claim 4, wherein:
an orthographic projection of the first output transistor on the plane of the array substrate and an orthographic projection of the second output transistor on the plane of the array substrate overlap in the second direction.

6. The array substrate according to claim 2, wherein:
each first shift register unit of the plurality of first shift register units includes a third output transistor and a first capacitor;
a source or drain of the third output transistor is electrically connected to an output terminal of the first shift register unit;
one of electrode plates of the first capacitor is electrically connected to a gate of the third output transistor; and
the first capacitor is located at a side of the third output transistor away from the display area.

7. The array substrate according to claim 6, wherein:
each first shift register unit of the plurality of first shift register units further includes a node control transistor, a first input transistor, and a fourth output transistor;
a first electrode of the fourth output transistor is electrically connected to the output terminal of the first shift register unit;
a second electrode of the fourth output transistor is electrically connected to a clock signal terminal;
in each of first shift register units of other stages except for a first shift register unit of the first stage among the plurality of first shift register units, a first electrode of the first node control transistor is electrically connected to the output terminal of a first shift register unit of the previous stage, a second electrode of the first node control transistor is electrically connected to a gate of the third output transistor, and a gate of the first node control transistor is coupled to the gate of the fourth output transistor and the second electrode of the first input transistor; and
in each of first shift register units of other stages except for the first shift register unit of the first stage among the plurality of first shift register units, a first electrode of the first input transistor is electrically connected to an output terminal of the first shift register of the previous stage and a second electrode of the first input transistor is coupled to a gate of the fourth output transistor.

8. The array substrate according to claim 7, wherein:
the first electrode of the first node control transistor and the first electrode of the first input transistor in the first shift register unit of the (j+1)-th stage are connected to the output terminal of the shift register unit of the j-th stage through a cascade wiring;
the cascade wiring extends along the first direction, and is located between the first shift register units of the j-th stage and the (j+1)-th stage; and
j is a positive integer.

9. The array substrate according to claim 2, further including a first fixed potential signal line and a second fixed potential signal line extending along the second direction, wherein:
the plurality of first shift register units and the plurality of second shift register units share the first fixed potential signal line and the second fixed potential signal line.

10. The array substrate according to claim 1, wherein:
along the second direction, the plurality of first shift register units is distributed between at least two adjacent second shift register units of the plurality of second shift register units.

11. The array substrate according to claim 1, wherein:
along the second direction, the plurality of first shift register units is distributed between any two adjacent second shift register units of the plurality of second shift register units.

12. The array substrate according to claim 11, wherein:
the plurality of first shift register units of the first gate driving circuit includes N cascaded first shift register units; and
along the second direction, i first shift register units of the N first shift register units are located between any two adjacent second shift register units, wherein i and N are positive integers and i≤N.

13. The array substrate according to claim 12, wherein:
i=2, and each of the plurality of second shift register units is electrically connected to two rows of the plurality of pixel circuits; or
i=4, and each of the plurality of second shift register units is electrically connected to four rows of the plurality of pixel circuits.

14. The array substrate according to claim 12, wherein:
i=2, wherein:
each second shift register unit of the plurality of second shift register units is electrically connected to two rows of the plurality of pixel circuits;
a total length of two adjacent first shift register units of the plurality of first shift register units and one corresponding second shift register unit of the plurality of second shift register units along the second direction is a first length;
a total length in the second direction of two pixel circuits of the plurality of pixel circuits adjacent along the second direction is a second length; and
the first length is same as the second length; or
i=4, wherein:
each second shift register unit of the plurality of second shift register units is electrically connected to four rows of the plurality of pixel circuits;
a total length of four adjacent first shift register units of the plurality of first shift register units and one corresponding second shift register unit of the plurality of second shift register units along the second direction is a third length;
a total length in the second direction of four pixel circuits of the plurality of pixel circuits adjacent along the second direction is a fourth length; and
the third length is same as the fourth length.

15. The array substrate according to claim 12, wherein:
i=2, wherein:
each second shift register unit of the plurality of second shift register units is electrically connected to two rows of the plurality of pixel circuits;
a length-width ratio of each of the plurality of first shift register units is about 4.5:1 to about 5.5:1; and a length-width ratio of each of the plurality of second shift register units is about 4.2:1 to about 5.2:1; or i=4, wherein:

each second shift register unit of the plurality of second shift register units is electrically connected to four rows of the plurality of pixel circuits;

a length-width ratio of each of the plurality of first shift register units is about 4.2:1 to about 5.2:1; and a length-width ratio of each of the plurality of second shift register units is about 4.0:1 to about 5.0:1, wherein:

the length-width ratio of one first shift register unit of the plurality of first shift register units is a ratio between a length of the first shift register unit in the first direction and a length of the first shift register unit in the second direction; and the length-width ratio of one second shift register unit is a ratio between a length of the second shift register unit in the first direction and a length of the second shift register unit in the second direction.

16. The array substrate according to claim 15, wherein:

i=2, wherein:

each second shift register unit of the plurality of second shift register units is electrically connected to two rows of the plurality of pixel circuits;

a length-width ratio of each of the plurality of first shift register units is about 5.0:1; and a length-width ratio of each of the plurality of second shift register units is about 4.7:1; or i=4, wherein:

each second shift register unit of the plurality of second shift register units is electrically connected to four rows of the plurality of pixel circuits;

a length-width ratio of each of the plurality of first shift register units is about 4.8:1; and a length-width ratio of each of the plurality of second shift register units is about 4.6:1.

17. The array substrate according to claim 15, wherein:

the length of the first shift register unit in the first direction equals to the length of the second shift register unit in the first direction.

18. The array substrate according to claim 15, wherein:

a total number of transistors and capacitors in the first shift register unit is smaller than a total number of transistors and capacitors in the second shift register unit, and the length of the first shift register unit in the first direction is smaller than the length of the second shift register unit in the second direction; or a total number of transistors and capacitors in the first shift register unit is larger than a total number of transistors and capacitors in the second shift register unit, and the length of the first shift register unit in the first direction is larger than the length of the second shift register unit in the second direction.

19. The array substrate according to claim 1, wherein:

along the second direction, a length of each of the plurality of first shift register units is smaller than a length of each of the plurality of pixel circuits; and/or along the second direction, a length of each of the plurality of second shift register units is smaller than a length of each of the plurality of pixel circuits.

20. The array substrate according to claim 1, further including a first clock signal line, wherein:

an orthographic projection of the first clock signal line on the plane of the array substrate intersects the orthographic projection of at least one of the first gate driving circuit and the second gate driving circuit on the plane of the array substrate.

21. A display panel comprising an array substrate with a display area and a non-display area surrounding the display area, wherein:

the array substrate includes:

a plurality of pixel circuits arranged in an array along a first direction and a second direction, wherein the plurality of pixel circuits are disposed in the display area and the first direction intersects the second direction;

a first gate driving circuit in the non-display area, wherein the first gate driving circuit includes a plurality of first shift register units in cascade connection;

a second gate driving circuit in the non-display area, the second gate driving circuit and the first gate driving circuit being at a same side of the display area, wherein the second gate driving circuit includes a plurality of second shift register units in cascade connection; and a first clock signal line, wherein:

the first gate driving circuit and the second gate driving circuit are electrically connected to different transistors in the plurality of pixel circuits;

an orthographic projection of the first gate driving circuit on a plane of the array substrate at least partially overlaps with an orthographic projection of the second gate driving circuit on the plane of the array substrate along the second direction; and an orthographic projection of the first clock signal line on the plane of the array substrate intersects an orthographic projection of at least one of the first gate driving circuit and the second gate driving circuit on the plane of the array substrate.

22. A display device including a display panel, wherein the display panel includes an array substrate with a display area and a non-display area surrounding the display area; and the array substrate includes:

a plurality of pixel circuits arranged in an array along a first direction and a second direction, wherein the plurality of pixel circuits are disposed in the display area and the first direction intersects the second direction;

a first gate driving circuit in the non-display area, wherein the first gate driving circuit includes a plurality of first shift register units in cascade connection; and a second gate driving circuit in the non-display area, the second gate driving circuit and the first gate driving circuit being at a same side of the display area, wherein the second gate driving circuit includes a plurality of second shift register units in cascade connection, wherein:

each second shift register unit of the plurality of second shift register units includes a first output transistor and a second output transistor;

the first gate driving circuit and the second gate driving circuit are electrically connected to different transistors in the plurality of pixel circuits;

an orthographic projection of the first gate driving circuit on a plane of the array substrate at least partially overlaps with an orthographic projection of the second gate driving circuit on the plane of the array substrate along the second direction; and an orthographic projection of the first output transistor on the plane of the array substrate and an orthographic projection of the second output transistor on the plane of the array substrate overlap in the second direction.

\* \* \* \* \*